United States Patent
Sautter et al.

(10) Patent No.: US 10,831,970 B2
(45) Date of Patent: Nov. 10, 2020

(54) LAYOUT OF A MEMORY CELL OF AN INTEGRATED CIRCUIT

(71) Applicant: International Business Machines Corporation, Armonk, NY (US)

(72) Inventors: Rolf Sautter, Bondorf (DE); Amira Rozenfeld, Hertzeliyya (IL); Shankar Kalyanasundaram, Bengaluru (IN); Ananth Nag Raja Darla, Bangalore (IN); Rajesh Veerabhadraiah, Tumkur (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/378,079

(22) Filed: Apr. 8, 2019

(65) Prior Publication Data

US 2020/0320174 A1    Oct. 8, 2020

(51) Int. Cl.
  *G06F 30/394*  (2020.01)
  *G11C 8/16*   (2006.01)
  *G11C 11/412* (2006.01)
  *G11C 11/418* (2006.01)
  *G11C 11/419* (2006.01)
  (Continued)

(52) U.S. Cl.
  CPC ......... *G06F 30/394* (2020.01); *G06F 30/327* (2020.01); *G06F 30/33* (2020.01); *G06F 30/392* (2020.01); *G06F 30/398* (2020.01); *G11C 8/16* (2013.01); *G11C 11/412* (2013.01); *G11C 11/418* (2013.01); *G11C 11/419* (2013.01)

(58) Field of Classification Search
  CPC ..... G06F 30/394; G06F 30/392; G06F 30/398

USPC ......................................................... 716/130
See application file for complete search history.

(56) References Cited

U.S. PATENT DOCUMENTS 5,541,850 A * 7/1996 Vander Zanden ...... G06F 30/30
                                                 716/102
5,572,436 A * 11/1996 Dangelo ............... G06F 11/261
                                                 716/102

(Continued)

OTHER PUBLICATIONS

Abdelhadi, et al., "Modular Multi-ported SRAM-based Memories", FPGA'14, Feb. 26-28, 2014, pp. 35-44, <https://dl.acm.org/citation.cfm?id=2554773>.

(Continued)

*Primary Examiner* — Suresh Memula
(74) *Attorney, Agent, or Firm* — Michael A. Petrocelli

(57) ABSTRACT

Techniques for generating a layout of a multi-port memory cell are provided. A specification describing at least on port within a memory cell is defined. A base memory cell including at least one extension point is modeled. A port that interfaces with the base memory cell is identified from the specification. An electrical interface between the identified port and an extension point of the base memory cell is modeled. In some embodiments, a design bucket is selected from among a predefined set of design buckets based on a count of ports within the memory cell, as described by the specification. Each design bucket corresponding to a respective layout template including the base memory cell and a respective maximum count of ports. Each electrical interface including a port described in the specification of the memory cell is modeled based on the selected design bucket and the respective layout template.

20 Claims, 19 Drawing Sheets

(51) Int. Cl.
  *G06F 30/33*    (2020.01)
  *G06F 30/327*   (2020.01)
  *G06F 30/392*   (2020.01)
  *G06F 30/398*   (2020.01)

(56) References Cited

U.S. PATENT DOCUMENTS

| | | | |
|---|---|---|---|
| 6,233,197 B1* | 5/2001 | Agrawal | G11C 7/18 |
| | | | 365/156 |
| 6,370,078 B1* | 4/2002 | Wik | G11C 7/18 |
| | | | 365/156 |
| 7,440,356 B2 | 10/2008 | Venkatraman | |
| 7,451,423 B1* | 11/2008 | Reynolds | G06F 30/34 |
| | | | 716/138 |
| 7,489,164 B2 | 2/2009 | Madurawe | |
| 8,374,050 B2 | 2/2013 | Zhou | |
| 9,223,910 B1* | 12/2015 | Ghosh | G06F 30/33 |
| 9,257,172 B2 | 2/2016 | Fujiwara | |
| 2008/0106953 A1 | 5/2008 | Madurawe | |
| 2009/0106716 A1* | 4/2009 | Aleksanyan | G01R 31/318357 |
| | | | 716/106 |
| 2011/0310691 A1 | 12/2011 | Zhou | |
| 2013/0258757 A1 | 10/2013 | Iyer | |
| 2015/0248927 A1 | 9/2015 | Fujiwara | |

OTHER PUBLICATIONS

Bhagyalakshmi, et al., "Design and VLSI Simulation of SRAM Memory Cells for Multi-ported SRAM's", International Journal of Research in Electronics and Communication Technology (IJRECT 2015), vol. 2, Issue 4 Oct.-Dec. 2015 , pp. 21-24, <http://ijrect.com/issues/vol2issue4/bhagyalakshmi.pdf>.

\* cited by examiner

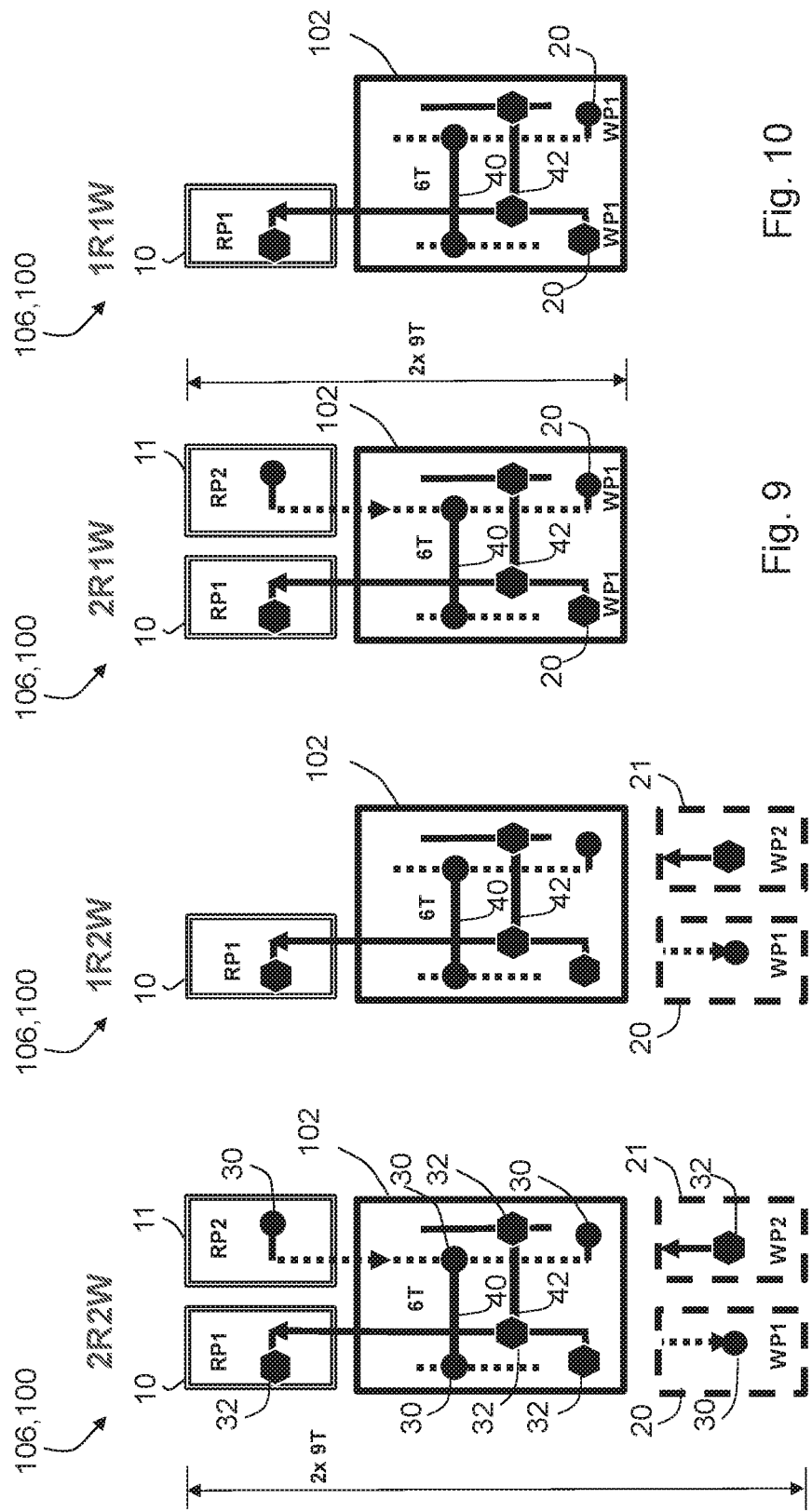

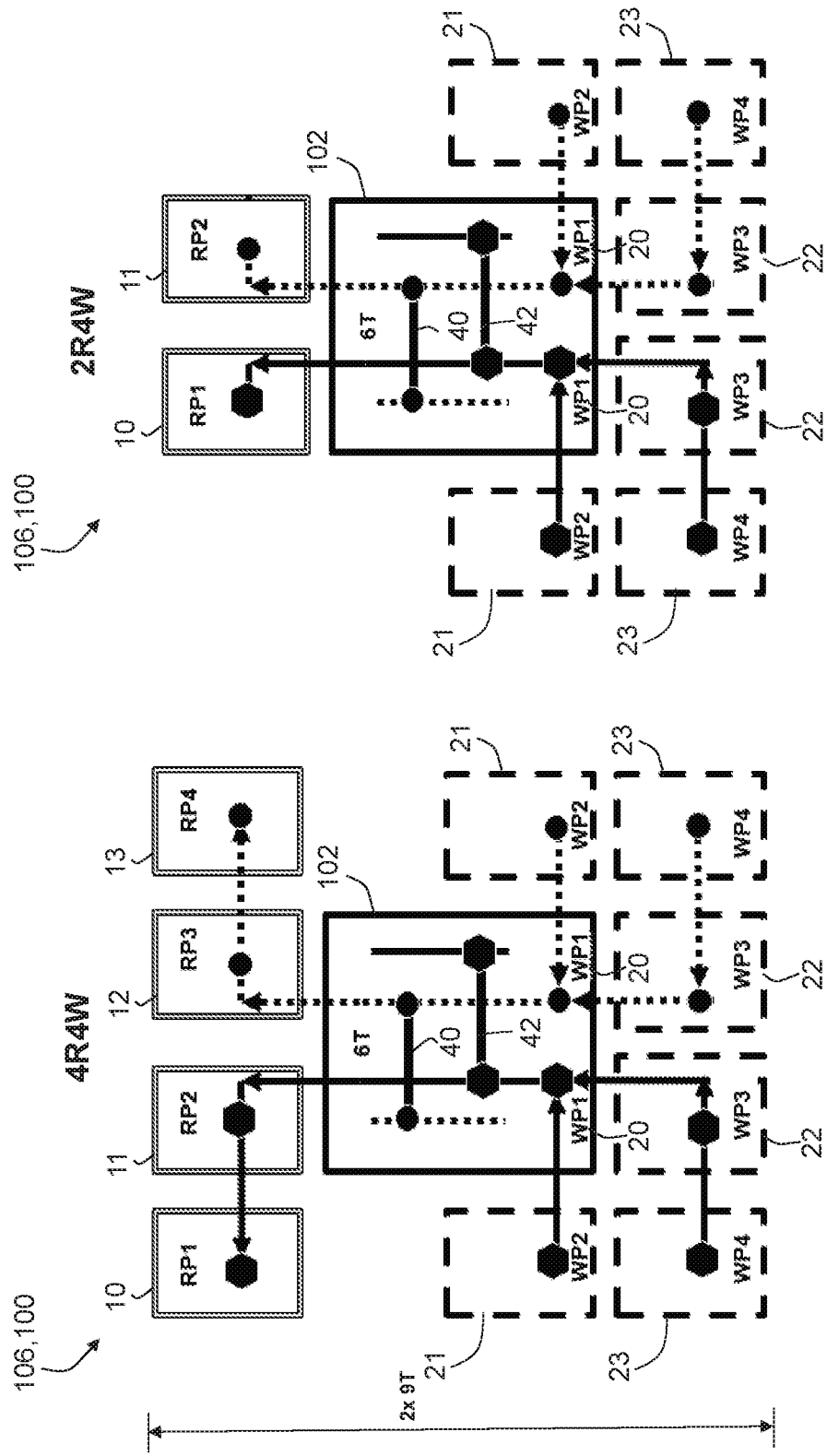

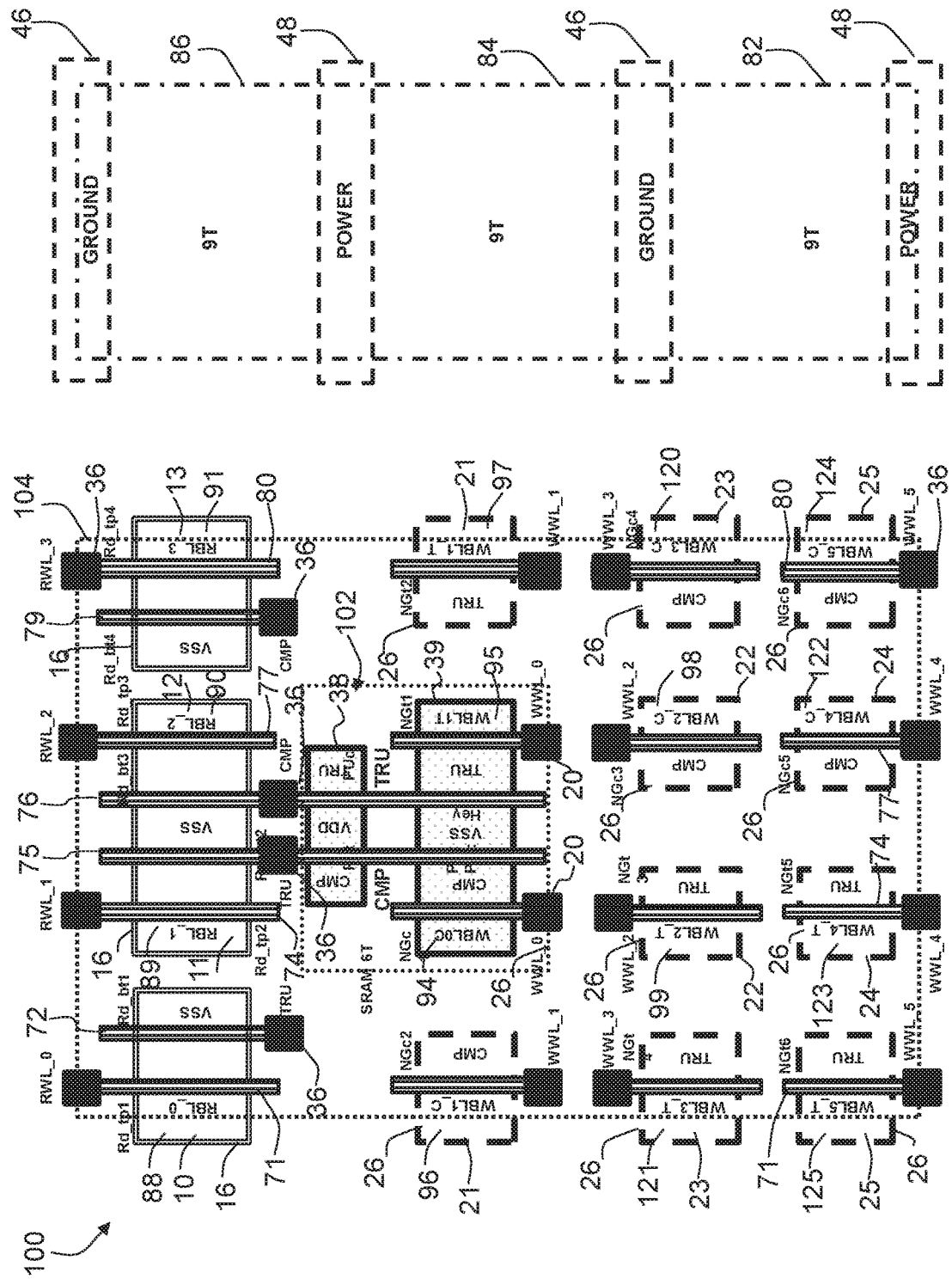

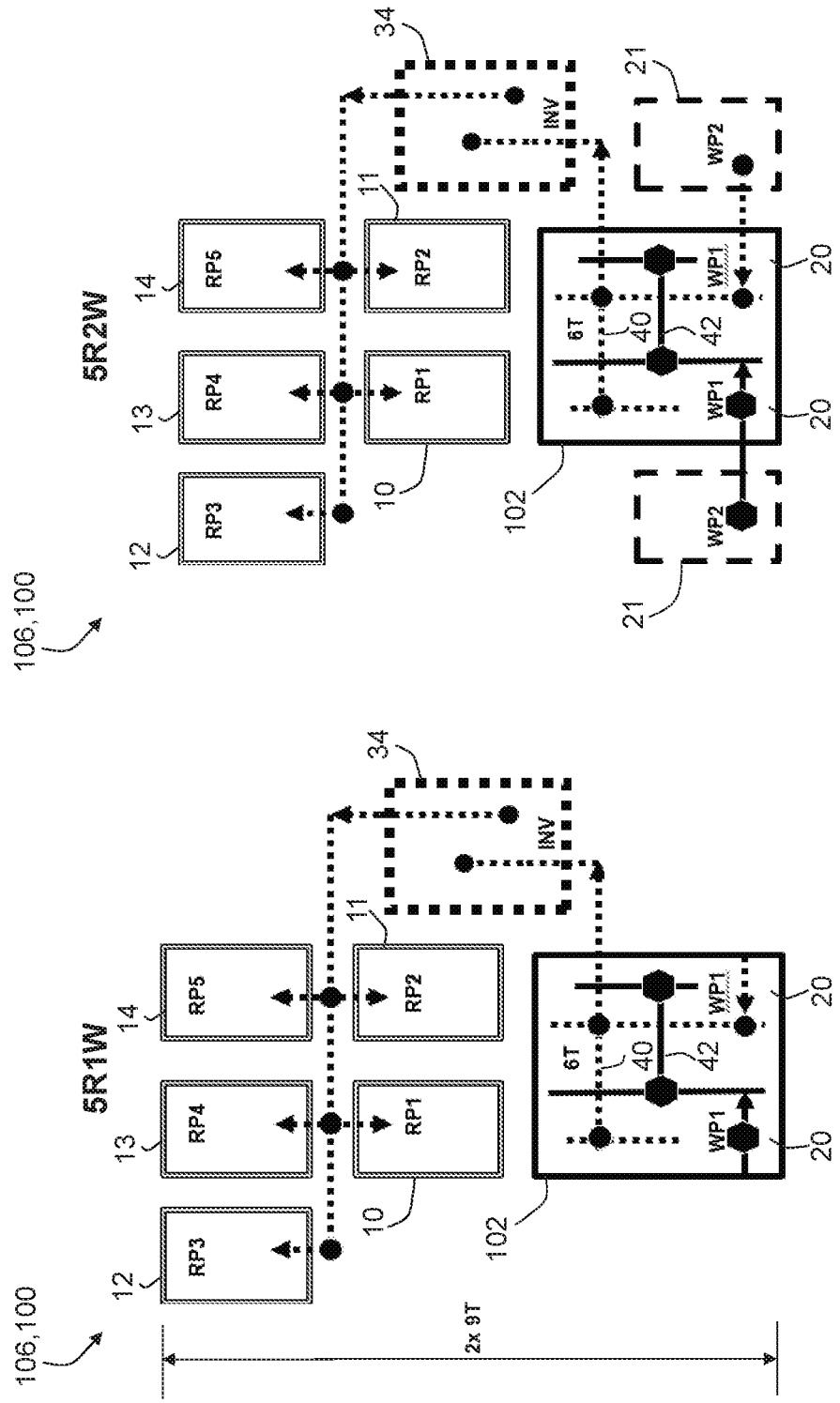

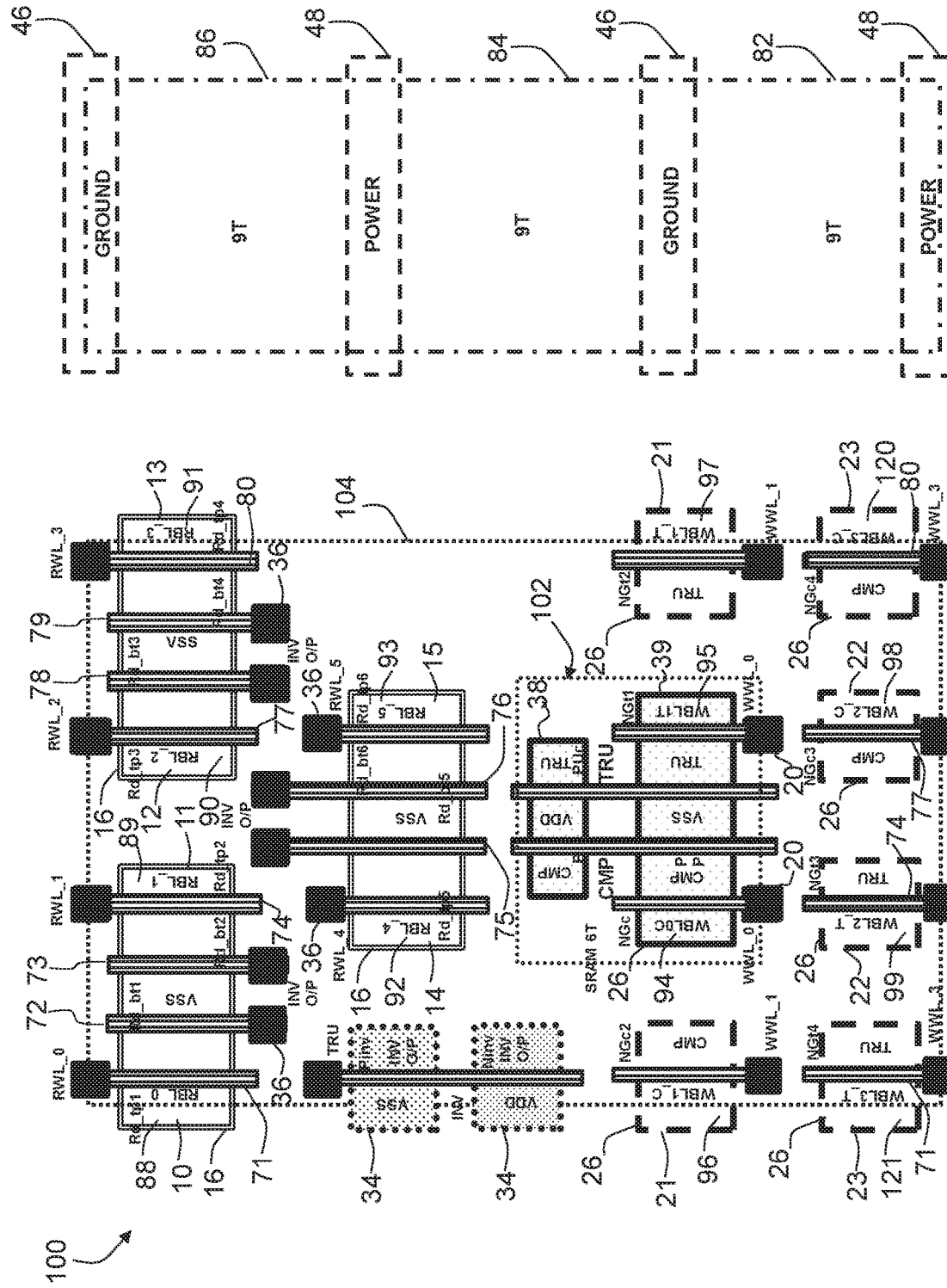

LAYOUT OF A MEMORY CELL OF AN INTEGRATED CIRCUIT

TECHNICAL FIELD

The present invention relates in general to data processing systems, and in particular, to a method for layout generation of a memory cell of an integrated circuit.

BACKGROUND

Development of improved semiconductor memory devices generally occurs via advances in materials, manufacturing processes, and designs of semiconductor devices. Recent enhancements include advances in the field of multi-port memories. Multi-port memories are widely used in electronic applications in which high-speed data transfer is critical, including, but not limited to, data buffering, video processing, data communications, etc.

Multi-port memory (e.g., dual port memory), unlike its single-port memory counterpart, is generally characterized by its ability to read data from or write data to the memory on one port while simultaneously reading a second piece of data from or writing a second piece of data to the memory on another port. Hence, each port provides a separate independent read and write access path for reading data from the memory or writing new data into the memory. One embodiment of a multi-port memory is a two-port memory, such as a single-port read, single-port write (1R1W) memory, which has a dedicated read port and a dedicated write port.

Multi-port memory is typically implemented using static random-access memory (SRAM). In a conventional single-port architecture, each bit in an SRAM cell is stored on four transistors that form two cross-coupled inverters operative as a storage element of the memory cell. Two additional transistors serve to control access to the storage element during read and write operations. A typical SRAM cell uses six transistors and is thus often referred to as 6T SRAM. In a multi-port architecture, two additional access transistors are generally used for each additional port; hence two-port functionality would be provided by an eight-transistor (8T) SRAM, three-port functionality would be provided by a ten transistor (10T) SRAM, and so on.

SUMMARY

According to one embodiment of the present invention, a method for generating a layout of a multi-port memory cell is provided. The method includes: defining a specification of a memory cell, the specification describing at least one port within the memory cell; modeling a base memory cell, wherein the base memory cell includes at least one extension point; identifying, within the specification, a port that interfaces with the base memory cell; and modeling an electrical interface between the port that interfaces with the base memory cell and an extension point of the base memory cell.

According to another embodiment of the present invention, a computer program product for generating a layout of a multi-port memory cell is provided. The computer program product comprises a computer readable storage medium and program instructions stored on the computer readable storage medium. The program instructions include: program instructions to define a specification of a memory cell, the specification describing at least one port within the memory cell; program instructions to model a base memory cell, wherein the base memory cell includes at least one extension point; program instructions to identify, within the specification, a port that interfaces with the base memory cell; and program instructions to model an electrical interface between the port that interfaces with the base memory cell and an extension point of the base memory cell.

According to another embodiment of the present invention, a computer system for generating a layout of a multi-port memory cell is provided. The computer system includes one or more computer processors, one or more computer readable storage media, and program instructions stored on the computer readable storage media for execution by at least one of the one or more processors. The program instructions include: program instructions to define a specification of a memory cell, the specification describing at least one port within the memory cell; program instructions to model a base memory cell, wherein the base memory cell includes at least one extension point; program instructions to identify, within the specification, a port that interfaces with the base memory cell; and program instructions to model an electrical interface between the port that interfaces with the base memory cell and an extension point of the base memory cell.

BRIEF DESCRIPTION OF THE DRAWINGS

FIG. 7 depicts a logical layout template of a memory cell with two read ports and two write ports according to a first design bucket of an embodiment of the invention.

FIG. 8 depicts a logical layout template of a memory cell with one read port and two write ports according to a first design bucket of an embodiment of the invention.

FIG. 9 depicts a logical layout template of a memory cell with two read ports and one write port according to a first design bucket of an embodiment of the invention.

FIG. 10 depicts a logical layout template of a memory cell with one read port and one write port according to a first design bucket of an embodiment of the invention.

FIG. 18 depicts a logical layout template of a memory cell with four read ports and four write ports according to a third design bucket of an embodiment of the invention.

FIG. 19 depicts a logical layout template of a memory cell with two read ports and four write ports according to a third design bucket of an embodiment of the invention.

FIGS. 20A and 20B depict a layout device placement configuration of the memory cell with four read ports and six write ports according to the embodiment of the invention depicted in FIG. 17.

FIG. 25 depicts a logical layout template of a memory cell with five read ports, one write port and load isolation inverter according to a third design bucket of an embodiment of the invention.

FIG. 26 depicts a logical layout template of a memory cell with five read ports, two write ports and load isolation inverter according to a third design bucket of an embodiment of the invention.

FIGS. 27A and 27B depict a logical layout template of the memory cell with six read ports, four write ports and load isolation inverter according to the embodiment of the invention depicted in FIG. 21.

DETAILED DESCRIPTION

Figure 1:
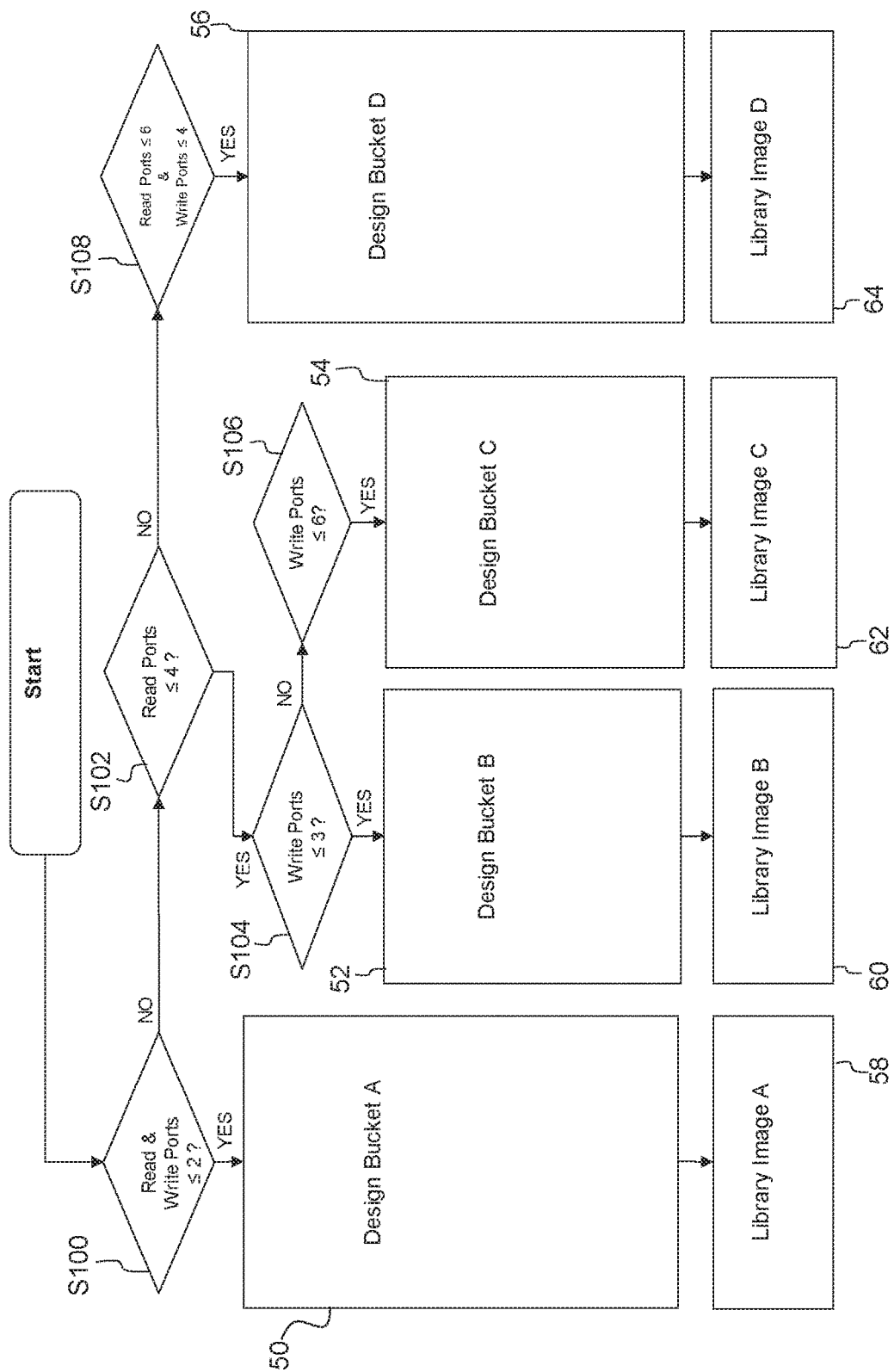
FIG. 1 depicts a flow chart of a general design algorithm for generating a layout of a memory cell of an integrated circuit according to an embodiment of the invention.

Embodiments of the present invention recognize that older integrated circuit layout technologies (e.g., 14 nm layouts) permitted wires to be shifted around freely with rectangular shapes. Newer technologies having structures below 14 nm (e.g., 7 nm layouts), however, require that wiring plans be defined upfront. Defining wiring plans up front requires projecting all possible scenarios, which is often resource intensive (e.g., in terms of time and computational resources).

Recognizing these disadvantages, among others, embodiments of the present invention provide a modular register file approach for modelling and/or implementing multi-port memory cell designs. The modular register file approach advantageously provides commonality in multi-port bit cell design methodology. The modular register file approach is particularly advantageous for generating/modeling layouts for memory cells in technologies with very narrow device structures (e.g., below 10 nm) as in self-aligned double patterning (SADP) technologies, for example. Self-aligned double patterning technologies incorporating a "sea of wires" approach include lines, defined in a metal layer, that are unidirectionally shaped, and interrupted by cut shapes only. Overlapping layers are connected using vias to define the intended geometrical structures.

Embodiments of the present invention further provide an advantageous design balance between "front end" and "back end" processing through design bucketing and symmetrical design elements. As will be appreciated by persons of ordinary skill in the art, front end and back end are terms that refer to different stages of wafer processing. These expressions are typically written as "Back End of Line" (BEOL) and "Front End of Line" (FEOL). Front End of Line refers to a first or "front" part of a wafer manufacturing line. In general, this is where the wafer-based devices are formed, such as transistors, poly capacitors, non-metal resistors, and diodes. Back end of Line refers to the last or "Back" part of the manufacturing line. In general, this is where the metal interconnects are formed as well where as any insulating overlay layers are added. Metal resistors, metal-metal capacitors, and inductors are generally built using these processes. Embodiment of present invention recognize that higher port-count memory cells may exhibit a better balance between front end and back end without any limiting factor, and that in high frequency designs, particularly for frequencies greater than 4 GHz, read and write port wiring will be resistance-capacitance (RC) and via resistance dominated.

As described herein, the modular nature of the modular register file approach can advantageously provide additional advantages. For example, leveraging commonality and a unified design approach can result in reduced turn-around time (e.g., for foundry design approval) for different types of configurations. Additionally, the design bucketing methodology described herein can facilitate the derivation of lower port configurations from higher ones in an efficient manner resulting in reduced layout development timelines. For example, and as described in greater detail herein, design modularity based on a six-transistor base cell (6T SRAM cell) can support efficient read/write port expandability by deriving new, lower port-count configurations (and/or higher port-count configurations) from respective design buckets. Use of a modular cell also permits an incremental design approach in which higher port-count configurations can be grown around the six-transistor base cell, for example. In some embodiments, e.g., designs with a number of read ports greater than five, an additional load isolation inverter may be able to drive the read ports. The inverter may isolate a load imposed from a complement (CMP) node in the 6T base cell by the read ports.

Embodiments of the present invention also enable the stressing and/or testing of sub-component layouts. The modular register file approach can therefore result in better yields and overall quality metrics due to device symmetry and modularity and permit systematic wiring of a memory block. It is therefore possible to achieve parametric multi-port bit cell support with configurability to support multi-port bit cell configurations. Additionally, the modular register file approach can provide individually programmable read and write ports and/or read and write ports that can be tuned, added/removed based on read/write noise margins, for example, among other factors.

Embodiments of the present inventions will now be described with respect to the drawings. In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

Figure 2:
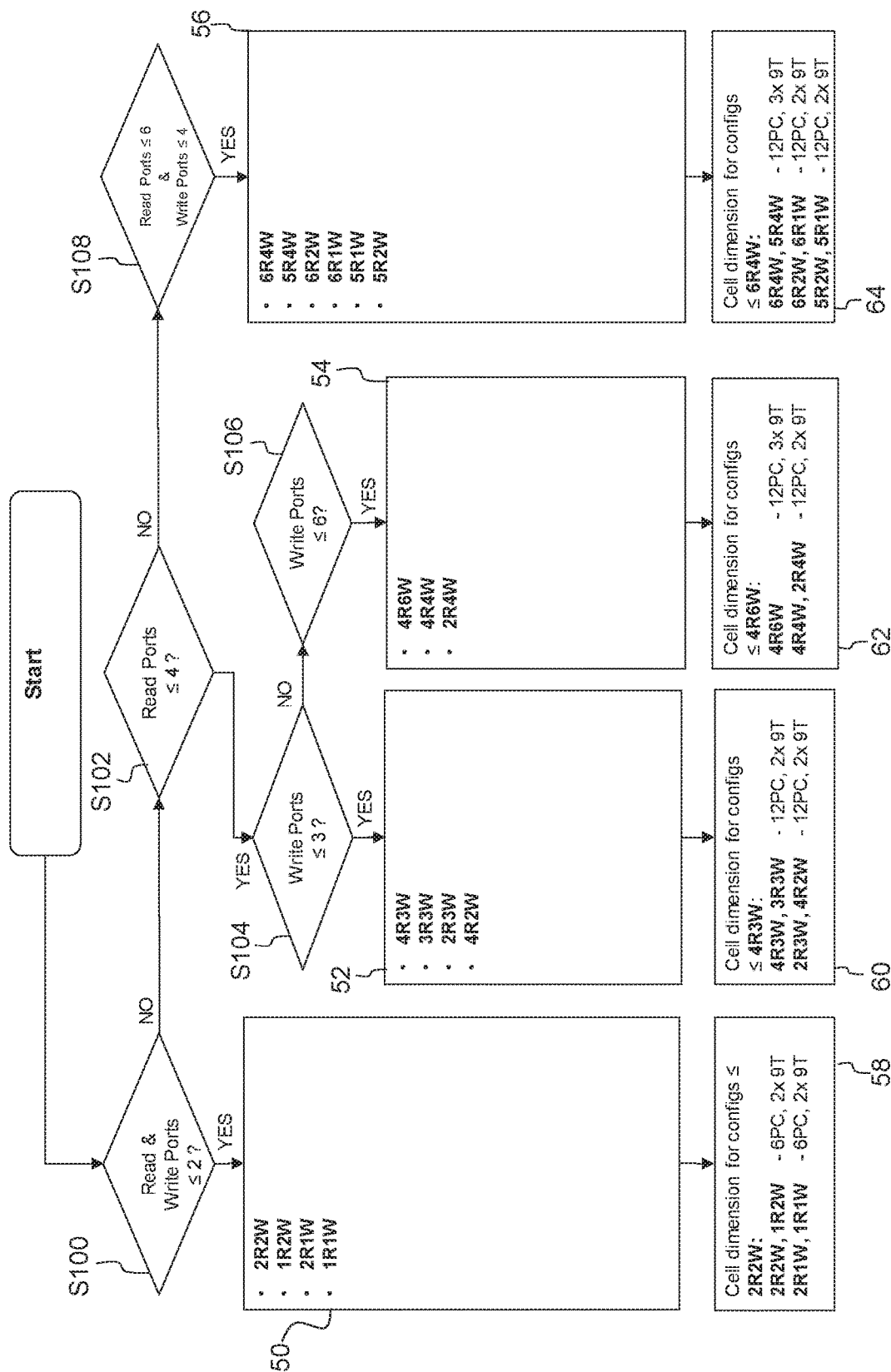
FIG. 2 depicts a flow chart of a specific embodiment of the design algorithm according to the embodiment of the invention depicted FIG. 1.

FIG. 1 depicts a flowchart of a general design algorithm for designing and/or modeling the layout of a memory cell 100 of an integrated circuit according to an embodiment of the invention, whereas FIG. 2 depicts a flow chart of a specific embodiment of the design algorithm according to the embodiment depicted in FIG. 1. Reference numerals used in the description of FIGS. 1 and 2 and not depicted in FIGS. 1 and 2 refer to elements of the embodiments shown in FIGS. 3 to 27.

In one embodiment, the general design algorithm includes (i) defining a specification of the memory cell 100 (e.g., see FIG. 6), the specification describing a number of ports 10, 11, 12, 13, 14, 15, 20, 21, 22, 23, 24, 25 of the memory cell 100; (ii) modeling a base memory cell 102; (iii) identifying a set of ports 10, 11, 12, 13, 14, 15, 20, 21, 22, 23, 24, 25, based on the specification; and (iv) creating the ports 10, 11, 12, 13, 14, 15, 20, 21, 22, 23, 24, 25 and placing the ports 10, 11, 12, 13, 14, 15, 20, 21, 22, 23, 24, 25 around the base memory cell 102. The base memory cell 102 herein comprises at least one extension point 40 for electrically connecting one of the ports 10, 11, 12, 13, 14, 15, 20, 21, 22, 23, 24, 25 to the base memory cell 102 via an electrical interface.

The embodiment of the general design algorithm further includes selecting one design bucket 50, 52, 54, 56 from a predefined set of design buckets 50, 52, 54, 56 based on the specification, wherein a design bucket 50, 52, 54, 56 defines a layout template 106 including the base memory cell 102 and a maximum number of ports 10, 11, 12, 13, 14, 15, 20, 21, 22, 23, 24, 25. Creating and placing (i.e., modeling) the ports 10, 11, 12, 13, 14, 15, 20, 21, 22, 23, 24, 25 is based on the selected design bucket 50, 52, 54, 56.

The ports 10, 11, 12, 13, 14, 15, 20, 21, 22, 23, 24, 25 include at least one of a read port 10, 11, 12, 13, 14, 15 or a write port 20, 21, 22, 23, 24, 25.

As shown in FIG. 1, according to the general design algorithm in step S100 the algorithm checks if a number of read ports 10, 11, 12, 13, 14, 15 and write ports 20, 21, 22, 23, 24, 25 is less than or equal to two. If this is the case (S100, YES branch), a first design bucket 50 is used.

If this is not the case (S100, NO branch), the general design algorithm, in step S102, checks if a number of read ports 10, 11, 12, 13, 14, 15 is less than or equal to four. If this is the case (S102, YES branch) then the general design algorithm, in step S104, checks if a number of write ports 20, 21, 22, 23, 24, 25 is less than or equal to three. If this is the case (S104, YES branch) a second design bucket 52 is used. Otherwise (S104, NO branch) the general design algorithm checks, in step S106, if a number of write ports 20, 21, 22, 23, 24, 25 is less than or equal to six. If this is the case (S106, YES branch) a third design bucket 54 is used.

For a layout with a maximum number of ports 10, 11, 12, 13, 14, 15, 20, 21, 22, 23, 24, 25 being less than or equal to eight, a two 9 track unit design image of the memory cell 100 is used, else a three 9 track unit design image is used. A track is defined as a minimum width and a minimum space of a first metal layer. The library design image system used may be based on a 9 track unit system, where a 9 track unit height is defined as a measure from a metal wiring unit based on a power layer at a boundary of the unit, followed by 7 wiring channels and a ground layer. The ground layer may then be shared with the next following unit. Multiple 9 track units may be layered one on top of another. The number of tracks thus defines a height of a multi-layer memory cell.

If the number of read ports 10, 11, 12, 13, 14, 15 in step S102 is greater than four (S102, NO branch), the general design algorithm, in step S108, checks if a number of read ports 10, 11, 12, 13, 14, 15 is less than or equal to six and a number of write ports 20, 21, 22, 23, 24, 25 is less than or equal to four. If this is the case (S108, YES, branch) a fourth design bucket 56 is used for layout of the memory cell 100.

The design buckets 50, 52, 54, 56 refer to cell dimensions 58, 60, 62, 64 specified for the specific layout templates contained in the design buckets 50, 52, 54, 56.

In FIG. 2 the specific layouts for a memory cell 100 contained in the design buckets 50, 52, 54, 56 are listed. The layouts are named according to the number of read ports 10, 11, 12, 13, 14, 15 and write ports 20, 21, 22, 23, 24, 25. For example, a name 2R2 W refers to a layout with two read ports 10, 11, 12, 13, 14, 15 and two write ports 20, 21, 22, 23, 24, 25. The cell dimensions 58, 60, 62, 64 refer to these layout names and list the according number of poly contacts 71, 72, 73, 74, 75, 76, 77, 78, 79, 80 (e.g., 6PC means a number of six poly contacts) as well as a height in number of 9 track units (e.g., 2× 9T means a height of two 9 track units) implemented in the memory cell 100. A poly contact (PC) usually represents a wire to the next via, but in some cases is also connecting two gates. Thus a poly contact pitch may be defined as a minimum distance between two gate connections. Thus dimensions of a memory cell 100 may be measured in one dimension with the number of poly contacts (e.g., "xx poly contacts wide", where xx is the number of poly contact pitches) and in the other dimension with the number of 9 track units (e.g., "height of yy 9 track units", where yy is the number of 9 track units).

A layout with a lower number of read ports 10, 11, 12, 13, 14, 15 and/or write ports 20, 21, 22, 23, 24, 25 is derived from a maximum configuration of read ports 10, 11, 12, 13, 14, 15 and/or write ports 20, 21, 22, 23, 24, 25 of the same design bucket 50, 52, 54, 56.

Figure 3:
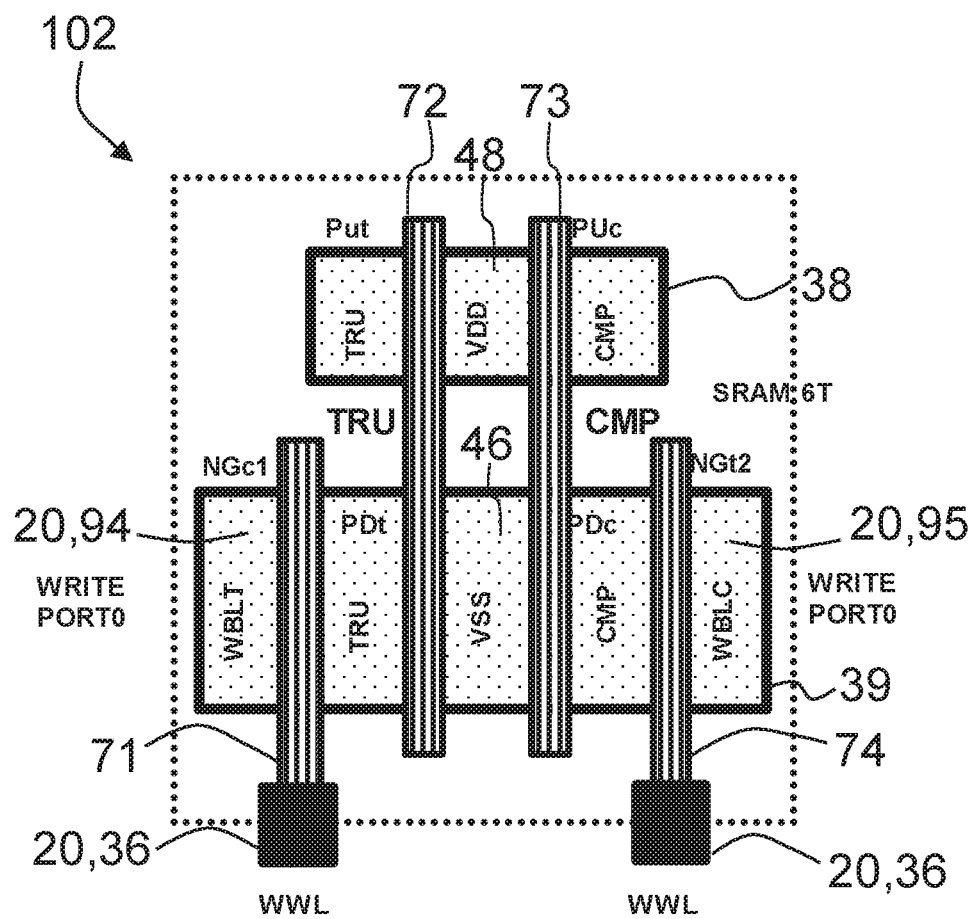
FIG. 3 depicts a layout device placement configuration of a base memory cell used for the layout of a memory cell of an integrated circuit according to an embodiment of the invention.

FIG. 3 depicts a layout device placement configuration of a base memory cell 102 used for the layout of a memory cell 100 of an integrated circuit according to an embodiment of the invention.

A six transistor SRAM layout is placed in two blocks 38, 39 (i.e., 6T SRAM 38 and 6T SRAM 39) on the base memory cell 102. The base memory cell 102 is four poly contacts (i.e., 71, 72, 73, 74) wide. Transistors are shared on the drain/source contact area. Thus the poly contacts 71, 72, 73, 74 create four N-channel field effect transistors with block 39 and two P-channel field effect transistors with block 38. A write bit line (WBLT) 94 of the block 39 is connected to drain of transmission gate transistor NGC1 and a true signal (TRU) is connected on the source. A write bit line 95 (WBLC) is connected to drain of transmission gate transistor NGt2 and a complement signal (CMP) is connected on the source. Vias on the poly contacts 71 and 74, respectively, as gate connection(s) 36, serve for connections as write word line (WWL) to an intrinsic write port 20. A ground line (VSS) (i.e., ground layer 46) and a power line (VDD) (i.e., ground layer 48) are connected on the shared drain or source contact of the different transistors. N-channel field effect transistors (FET) on block 39 are connected to p-channel FETs on block 38 via the poly contacts 72, 73.

References Put, PUc, NGc1, NGt2 are abbreviations for the device names in the logical layout. NGxx refers to transmission gates, PUxx refers to pull up devices, PDxx to pull down devices, RDxx refers to read ports.

Figure 4:
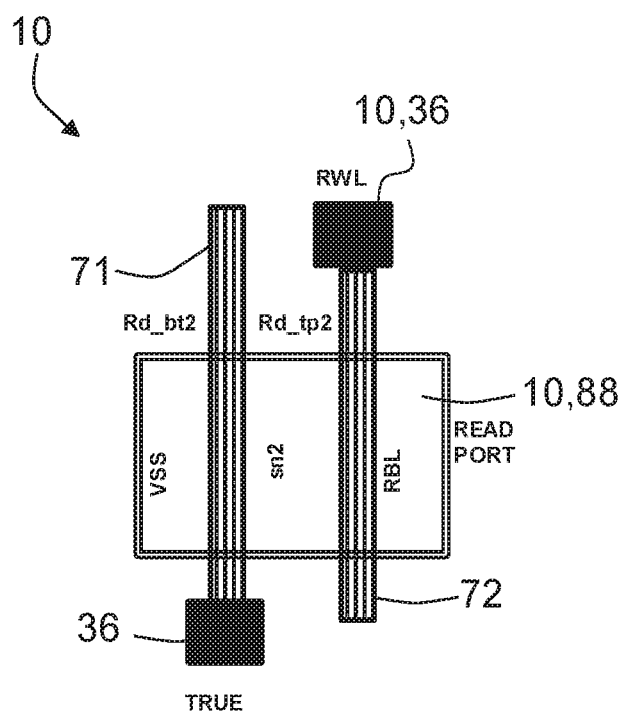
FIG. 4 depicts a generic layout device placement configuration of a read port according to an embodiment of the invention.

FIG. 4 depicts a generic logical device placement configuration of a read port 10. The read word line (RWL) gate connection 36 of the read port 10 is connected via a poly contact 72 to a read bit line 88. Another poly contact 71 interconnects the read port 10 with the true node of a 6T SRAM cell.

Figure 5:
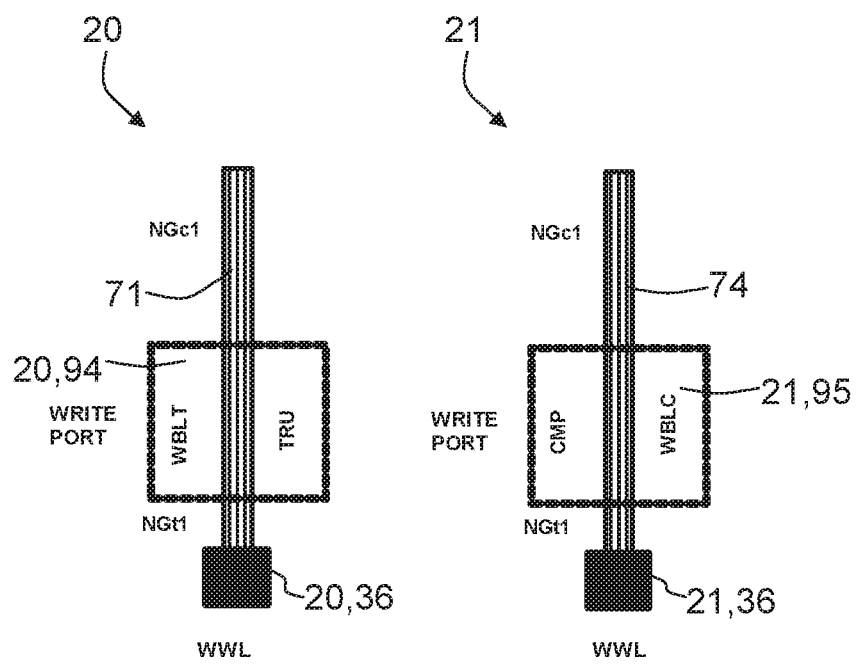
FIG. 5 depicts a generic layout device placement configuration of two write ports with true and complement gate connections according to an embodiment of the invention.

FIG. 5 depicts a generic logical layout configuration of write ports 20 with write word line (WWL) gate connections 36. The gate connections 36 are connected via poly contacts 71 and 74, to the write word line metal layer. The write ports WBLT 94 and WBLC 95 are connected respectively to the true (TRU) or complement (CMP) node of the 6T SRAM cell.

Figure 6:
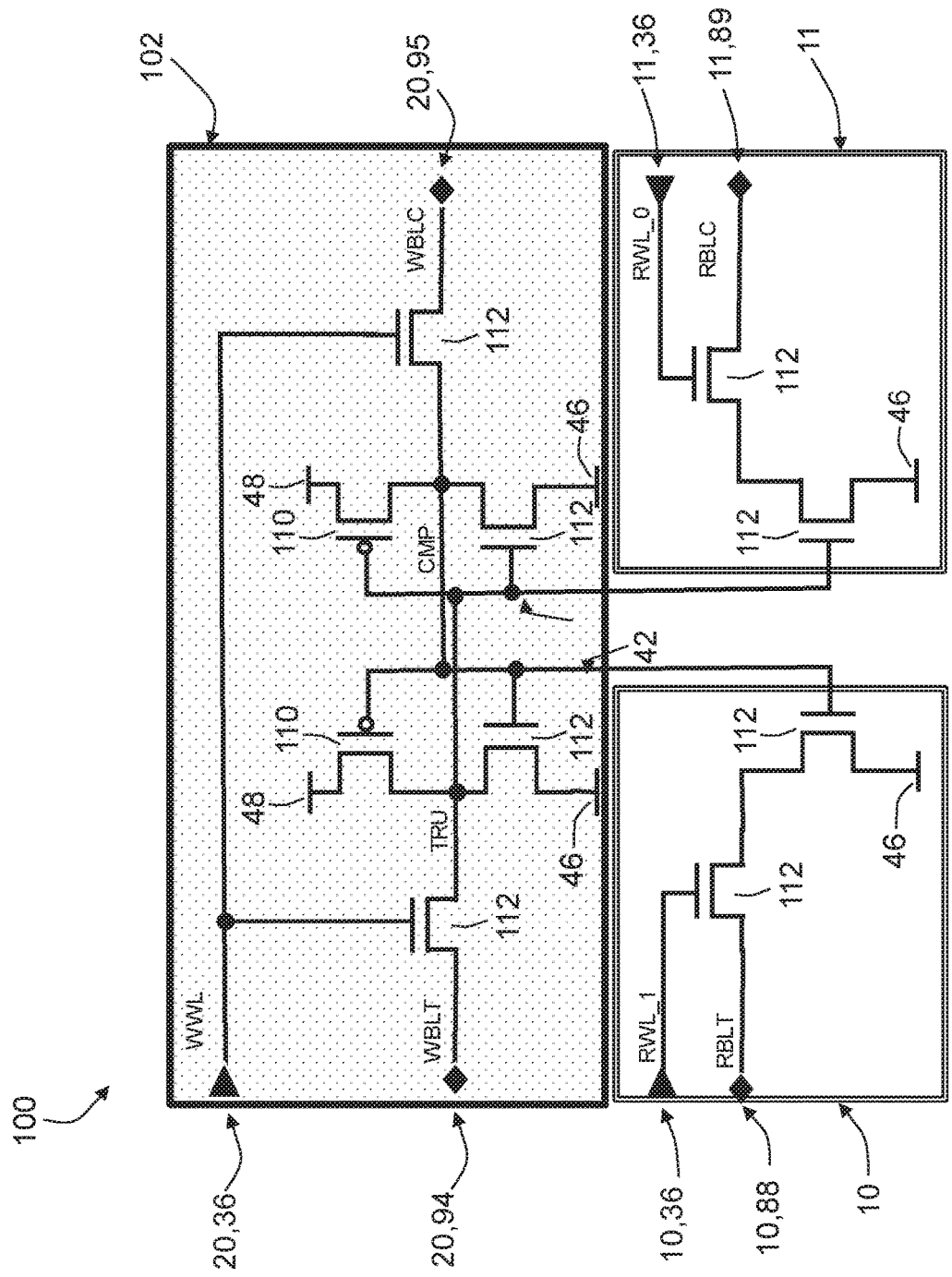
FIG. 6 depicts a schematic configuration of a memory cell with two read ports and one write port according to an embodiment of the invention.

FIG. 6 depicts a schematic configuration of a memory cell 100 with two read ports 10, 11 and one intrinsic write port 20 according to an embodiment of the invention. Read ports 10, 11 are created adjacent to a base memory cell 102, connected via extension points 40, 42 to the base memory cell 102.

The base memory cell 102 comprises six transistors, four n-channel FETs 112 and two p-channel FETs 110, and one intrinsic write ports 20. The base memory cell 102 is based on a topology with two write bit lines 94, 95. The intrinsic write port 20 is accessible via a write word line with a gate connection 36. The base memory cell 102 is connected to ground layer 46 and power layer 48.

The read ports 10, 11 are connected to the base memory cell via the extension points 40, 42 as connections between a n-channel FET 112 and a p-channel FET 110 each. Read bit lines 88, 89 are implemented as a true and a complement signal for the read ports 10 and 11, respectively. The read ports 10, 11 are accessible via gate connections 36 to the respective read word lines. The read ports 10, 11 are connected to ground layer 46.

In FIGS. 7, 8, 9, and 10 logical layout templates 106 of a memory cell 100 with different numbers of read ports 10, 11 and write ports 20, 21 included in the first design bucket 50 are depicted.

FIG. 7 depicts a logical layout template 106 of a memory cell 100 with two read ports 10, 11 and two write ports 20, 21 according to the first design bucket 50 of an embodiment of the invention. Similarly: FIG. 8 depicts a logical layout template 106 of a memory cell 100 with one read port 10 and two write ports 20, 21; FIG. 9 depicts a logical layout template 106 of a memory cell 100 with two read ports 10, 11 and one write port 20; and FIG. 10 depicts a logical layout template 106 of a memory cell 100 with one read port 10 and one write port 20. The layout templates are generally 6 poly contact (PC) wide and have a height of two 9 track units. The embodiments shown in FIGS. 7 to 10, as well as in all other logical layout templates shown, mark true storage nodes 30 of the memory cell 100 with black circles and complement storage nodes 32 with black hexagons. True storage nodes 30 are connected via a dotted lines and complement storage nodes 32 with solid lines.

Figures 11A, 11B:
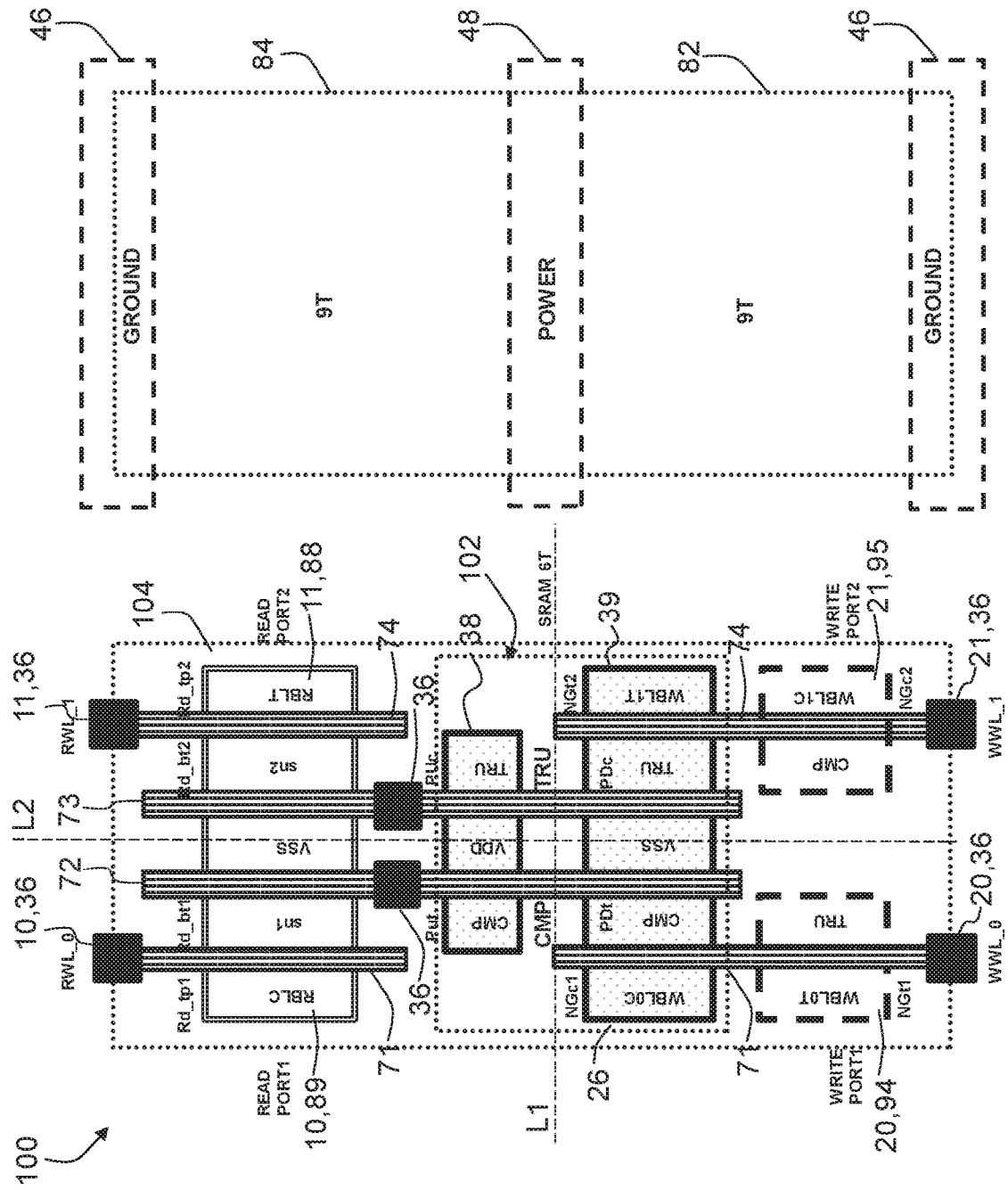
FIGS. 11A and 11B depict a layout device placement configuration of a memory cell with two read ports and two write ports according to the embodiment of the invention depicted in FIG. 7.

FIGS. 11A and 11B depicts a layout device placement configuration of the memory cell 102 with two read ports 10, 11 and two write ports 20, 21 according to the embodiment depicted in FIG. 7. The configuration with the highest number of read ports 10, 11 and write ports 20, 21 is chosen for explanation because the configurations with a lower number of read ports 10, 11 and write ports 20, 21 are derived from the configuration with the highest number for configurations of the same design bucket 50, as for all configurations of other design buckets 52, 54, 56.

For the embodiment shown in FIG. 11A, read ports 10, 11 and write port 21 are added to the design of the base memory cell 102. The base memory cell 102 is marked by a dotted rectangle. As in the layout template 106 for the base memory cell 102, shown in FIG. 3, the six transistor SRAM layout is implemented in two blocks 38, 39 (i.e., 6T SRAM 38 and 6T SRAM 39) on the base memory cell 102. In the SRAM circuit (i.e., block 39) a write bit line 94 is implemented for a complement state and a write bit line 95 for a true state of the write data. The memory cell 100 is four poly contacts wide and has a height of two 9 track units. Poly contacts 71, 72, 73, 74 are placed on the memory cell 100 connecting the SRAM circuit (i.e., block 38, 39) to respective read ports 10, 11. Breaks are introduced in the poly contacts 71, 74 (e.g., by cut shapes). In the read port 11, a read bit line 88 (RBLT) is implemented for the true state and in the read port 10 a read bit line 89 (RBLC) for the complement state. The write port 20 is connected through PC to write word line WWL_0, the write port 21 as write word line WWL_1, the read port 10 as read word line RWL_0, the read port 11 as read word line RWL_1, respectively, via gate connections 36. In FIG. 11B, the positions of ground layers 46 and a power layer 48 as well as positions for a first 9 track unit 82 and a second 9 track unit 84 are indicated in a floor plan. Ground layer 46 is arranged at the bottom and separated by the first 9 track unit 82 from power layer 48 arranged in the middle which is separated by the further 9 track unit 84 from the ground layer 46 on the top. Block 39 of the SRAM circuit is electrically connected to ground layer 46 (VSS), block 38 to power 48 (VDD), and the read port circuit 16 to ground layer 46 (VSS).

The layout template 106 of the memory cell 100 is suited for manufacture in a Self-Aligned Double Patterning technique.

The extension points 40, 42 in the layouts shown in FIGS. 7 to 9 are located at a poly contact 71, 72, 73, 74 for connecting the ports 10, 11, 20, 21 to the SRAM circuit (i.e., blocks 38, 39) of the underlying base memory cell 102. Breaks in poly contacts 71, 72, 73, 74 can be introduced by cut shapes (e.g., wherein spacing and length constraints may be relevant PC shapes).

The ports 10, 11, 20, 21 are placed symmetrically to the base memory cell 102 in a first direction. The read ports 10, 11 are placed symmetrically to the write ports 20, 21 related to a first symmetry line L1. The read ports 10, 11 and the write ports 20, 21 are placed symmetrically to each other related to a second symmetry line L2 of the base memory cell 102.

The poly contacts 71, 72, 73, 74 are used for wiring partially true/complement signals. The drain and source connection of the true/complement signals are wired through Metal 1 (M1) and Metal 2 (M2) wires which are not part of the figure.

Read word lines 88, 89 and write word lines 94, 95 are preferably placed adjacent to each other.

In FIGS. 12, 13, 14, and 15 logical layout templates 106 of a memory cell 100 with different numbers of read ports 10, 11, 12, 13 and write ports 20, 21, 22 comprised in the second design bucket 52 of FIGS. 1 and 2 are depicted in accordance with respective embodiments.

Figures 12, 13:
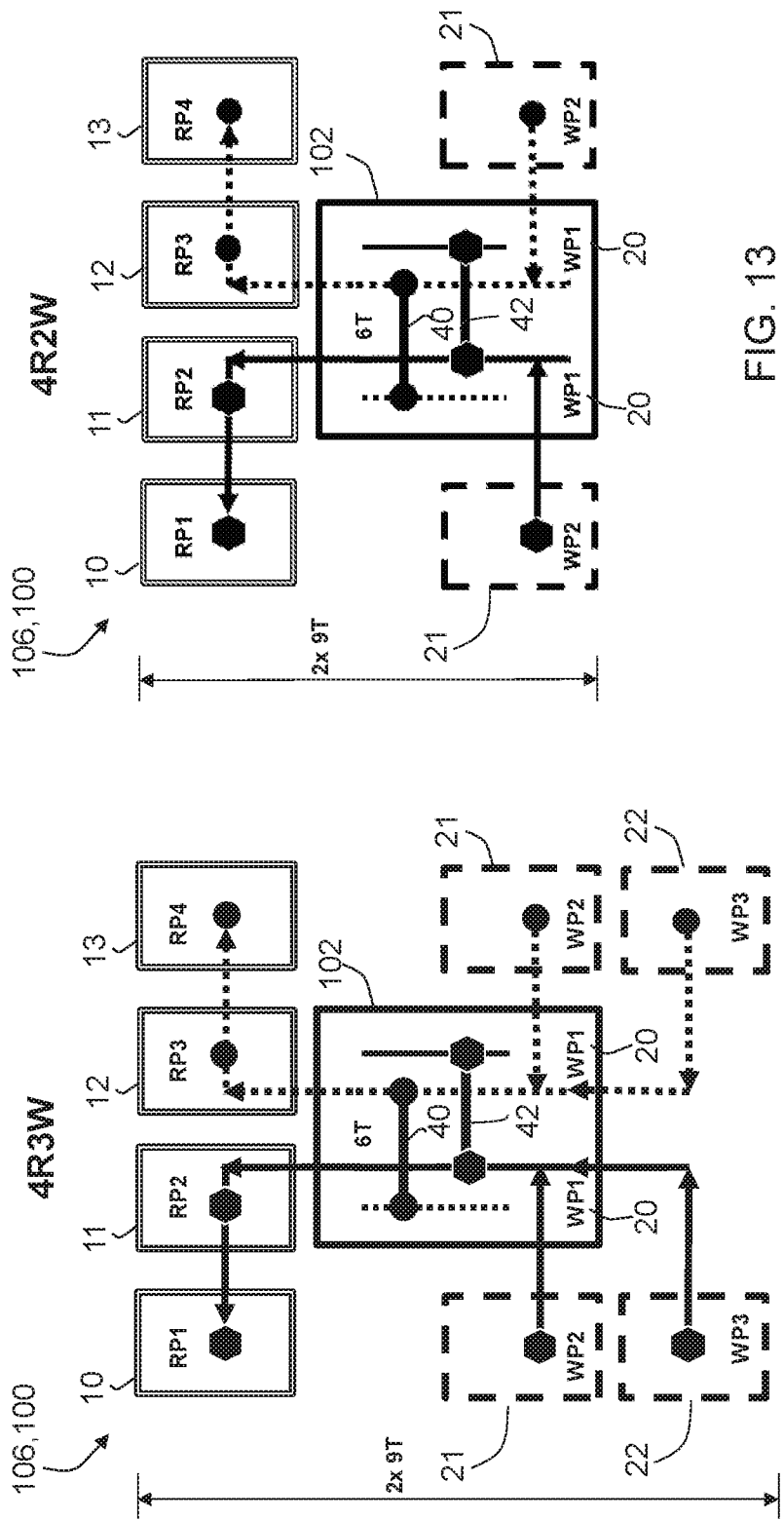
FIG. 12 depicts a logical layout template of a memory cell with four read ports and three write ports according to a second design bucket of an embodiment of the invention.
FIG. 13 depicts a logical layout template of a memory cell with four read ports and two write ports according to a second design bucket of an embodiment of the invention.
Figure 15:
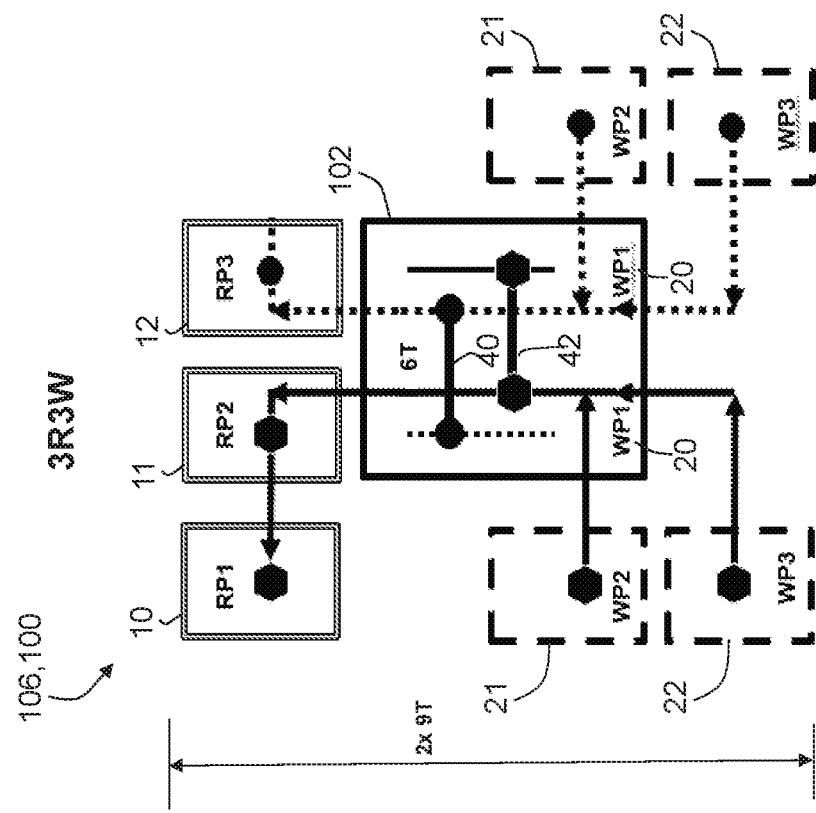
FIG. 15 depicts a logical layout template of a memory cell with three read ports and three write ports according to a second design bucket of an embodiment of the invention.
Figure 14:
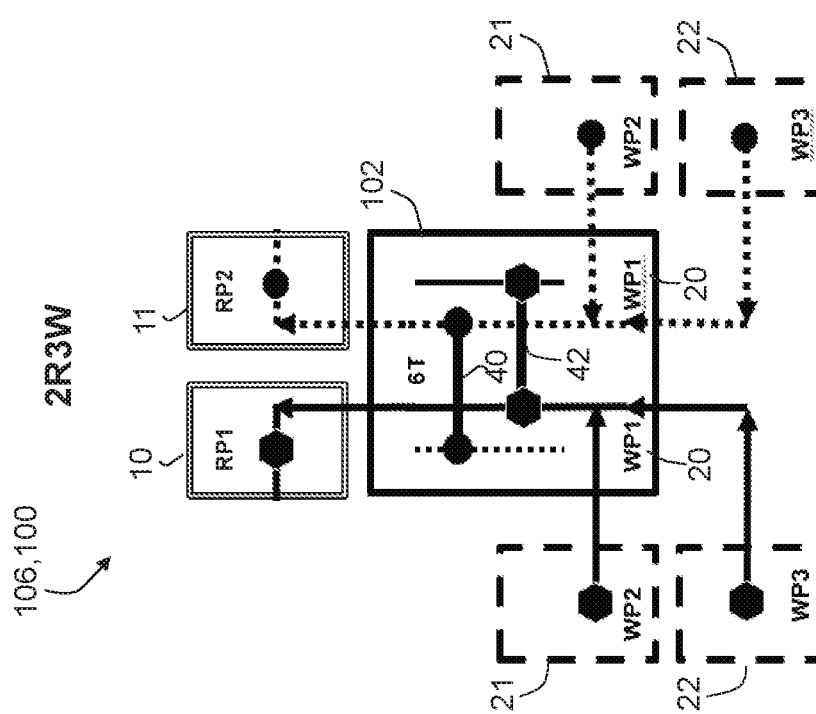
FIG. 14 depicts a logical layout template of a memory cell with two read ports and three write ports according to a second design bucket of an embodiment of the invention.

FIG. 12 depicts a logical layout template 106 of a memory cell 100 with four read ports 10, 11, 12, 13 and three write ports 20, 21, 22 according to the second design bucket 52 of an embodiment of the invention. Similarly, FIG. 13 depicts a logical layout template 106 of a memory cell 100 with four read ports 10, 11, 12, 13 and two write ports 20, 21; FIG. 14 depicts a logical layout template 106 of a memory cell 100 with two read ports 10, 11 and three write ports 20, 21, 22; and FIG. 15 depicts a logical layout template 106 of a memory cell 100 with three read ports 10, 11, 12 and three write ports 20, 21, 22. The layout templates 106 are generally twelve contacted poly pitch (CPP) wide at the front end of line and have two 9 track units in height. The embodiments shown in FIGS. 12 to 15, as well as in all other logical layouts shown, mark true storage nodes 30 of the memory cell 100 with black circles and complement storage nodes 32 with black hexagons. True storage nodes 30 are connected via dotted lines and complement storage nodes 32 with solid lines.

Figures 16A, 16B:
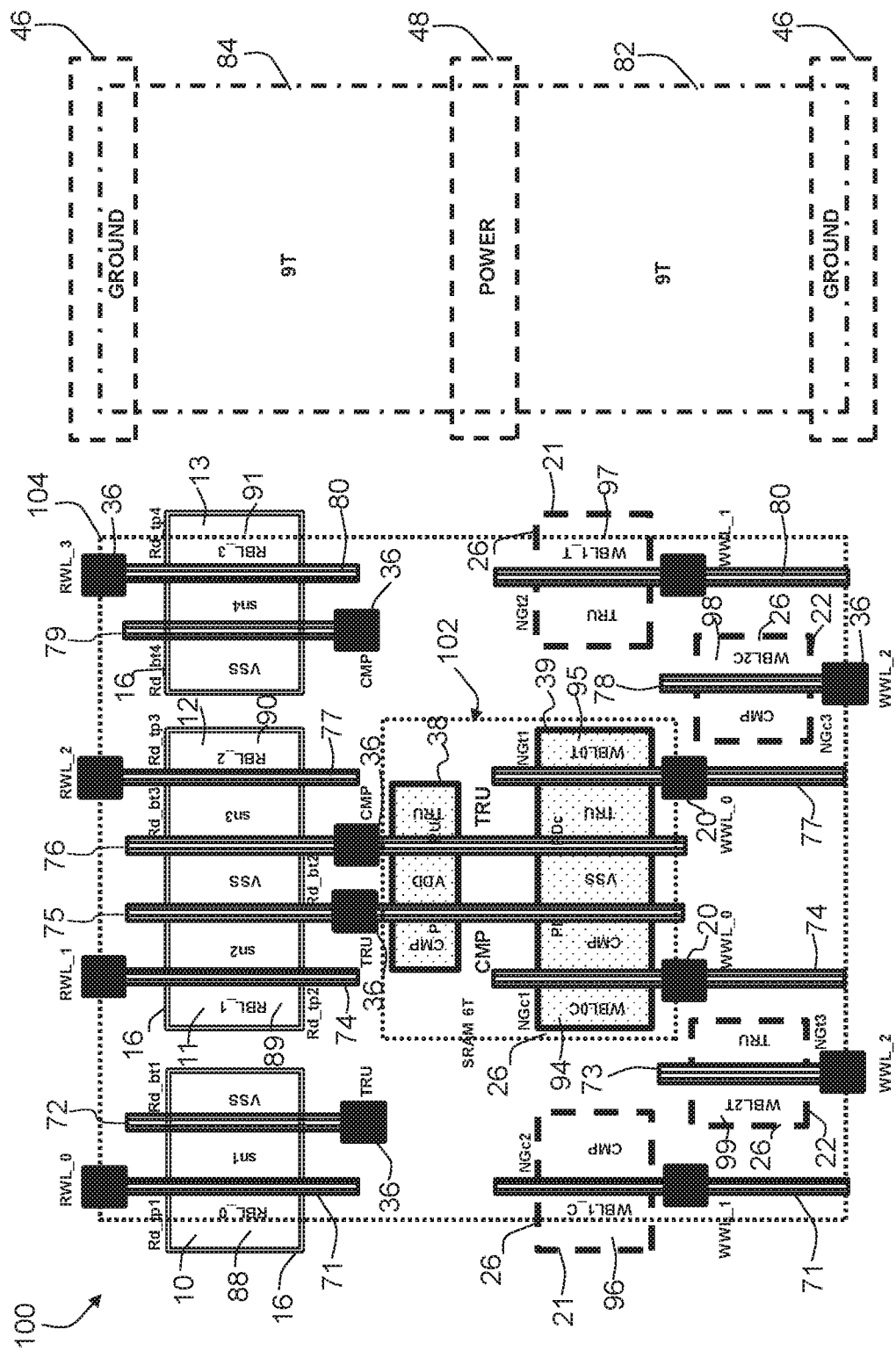
FIGS. 16A and 16B depict a layout device placement configuration of the memory cell with four read ports and three write ports according to the embodiment of the invention depicted in FIG. 12.

FIGS. 16A and 16B depict a layout device placement configuration of the memory cell 100 with four read ports 10, 11, 12, 13 and three write ports 20, 21, 23 according to FIG. 12.

For the embodiment shown in FIG. 16A, read ports 10, 11, 12, 13 and write ports 21, 22 are added to the design of the base memory cell 102. Therefore, as in the layout configuration for the base memory cell 102 shown in FIG. 3, the six transistor SRAM layout is implemented in two blocks 38, 39 on the memory cell 102. In the SRAM layout (i.e., block 39) a write bit line 94 is implemented for a complement state and a write bit line 95 for a true state of the write port 20. Further write bit lines 96, 97, 98, 99 are placed in the further write ports 21, 22. The memory cell 100 is twelve contacted poly pitch (CPP) wide and has a height of two 9 track units. Poly wiring 75, 76, are placed on the memory cell 100 connecting the SRAM layout (i.e., blocks 38, 39) to read ports 11, 12. In the read ports 11, 12 read bit lines 89, 90, are connected.

The connections true/complement nodes of the read port 10, 13 are implemented with the M1 and M2 metal layer. The write port 20 is connected as write word line WWL_0, the write port 21 as write word line WWL_1, the write port 22 as write word line WWL_2, the read port 10 as read word line RWL_0, the read port 11 as read word line RWL_1, the read port 12 as read word line RWL_2, and the read port 13 as read port line RWL_3, respectively, via gate connections 36. In FIG. 16B, the positions of ground layers 46 and a power layer 48 as well as positions for a first 9 track unit 82 and a second 9 track unit 84 are indicated in a floor plan. Ground layer 46 is arranged at the bottom and separated by the 9 track unit 82 from power layer 48 arranged in the middle which is separated by the further 9 track unit 84 from ground layer 46 on the top. Block 39 of the SRAM layout is electrically connected to ground 46 (VSS), block 38 to power layer 48 (VDD), and the read port circuits 16 to ground 46 (VSS).

Figure 17:
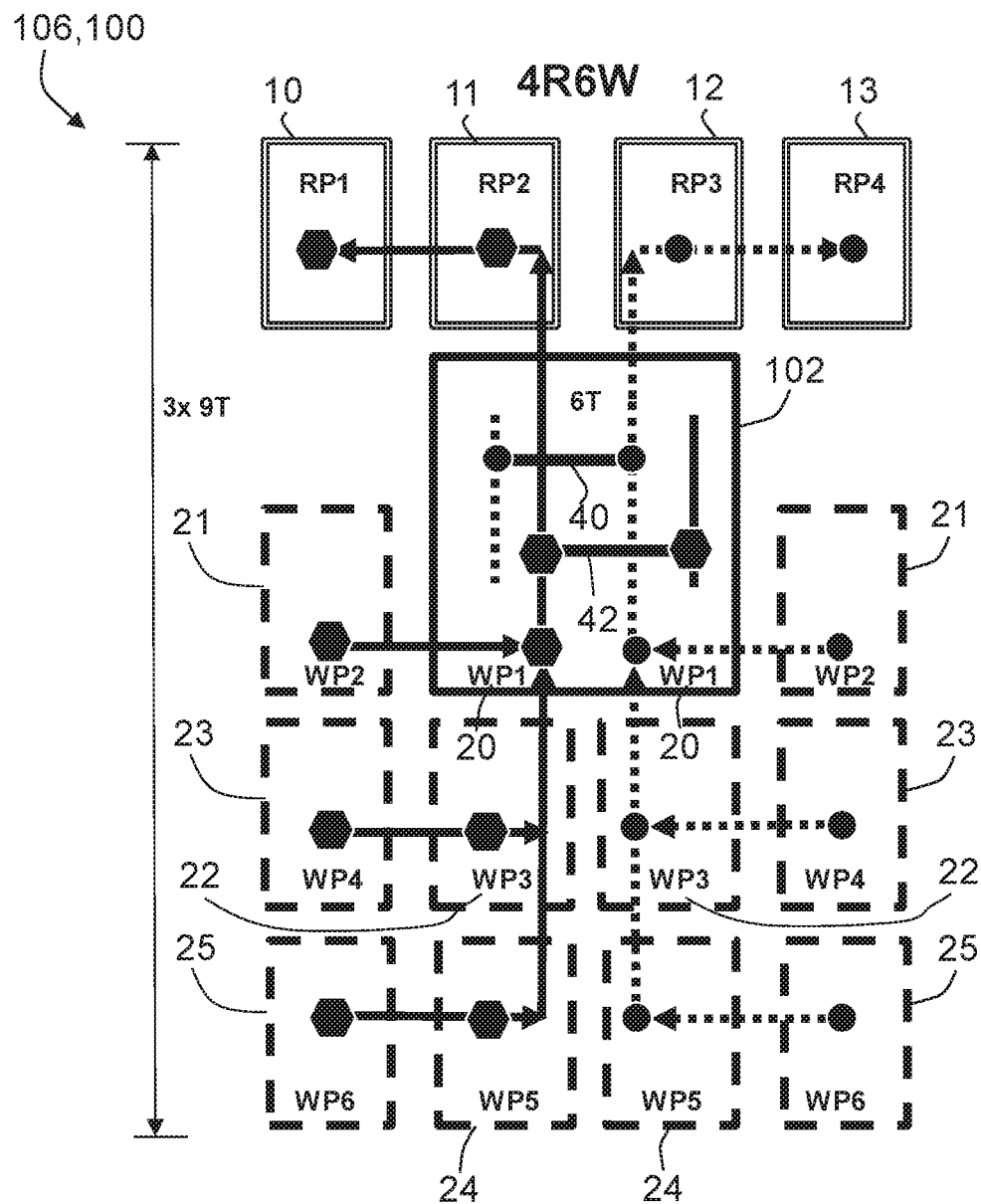
FIG. 17 depicts a logical layout template of a memory cell with four read ports and six write ports according to a third design bucket of an embodiment of the invention.

In FIGS. 17, 18, and 19, logical layout templates 106 of a memory cell 100 with different numbers of read ports 10, 11, 12, 13 and write ports 20, 21, 22, 23, 24, 25 included in the third design bucket 54 of FIGS. 1 and 2 are depicted in accordance with respective embodiments of the present invention.

FIG. 17 depicts a logical layout template 106 of a memory cell 100 with four read ports 10, 11, 12, 13 and six write ports 20, 21, 22, 23, 24, 25 included in the third design bucket 54 of an embodiment of the invention. Similarly, FIG. 18 depicts a logical layout template 106 of a memory cell 100 with four read ports 10, 11, 12, 13 and four write ports 20, 21, 22, 23 and FIG. 19 depicts a logical layout template 106 of a memory cell 100 with two read ports 10, 11 and four write ports 20, 21, 22, 23. The layout templates 106 are generally twelve contacted poly pitch (CPP) wide at the front end of line and have a height of three 9 track units for the layout of FIG. 17 and two 9 track units for the layouts of FIGS. 18 and 19. The embodiments shown in FIGS. 17 to 19, as well as in all other logical layouts shown, mark true storage nodes 30 of the memory cell 100 with black circles and complement storage nodes with black hexagons 32. True storage nodes 30 are connected via dotted lines and complement storage nodes 32 with solid lines.

FIGS. 20A and 20B depict a layout device placement configuration of the memory cell 100 with four read ports 10, 11, 12, 13 and six write ports 20, 21, 22, 23, 24, 25 according to the embodiment depicted in FIG. 17.

For the embodiment shown in FIG. 20A, read ports 10, 11, 12, 13 and write ports 21, 22, 23, 24, 25 are added to the design of the base memory cell 102. Therefore, as in the layout configuration for the base memory cell 102 shown in FIG. 3, the six transistor SRAM layout is implemented in two blocks 38, 39 on the memory cell 100. In the SRAM layout (i.e., block 39) a write bit line 94 is implemented for a complement state and a write bit line 95 for a true state of write port 20. Further write bit lines 96, 97, 98, 99, 120, 121, 122, 123, 124, 125 are placed in the further write ports 21, 22, 23, 24, 25. The memory cell 100 is twelve contacted poly pitch (CPP) wide and has a height of three 9 track units. Poly wires 75, 76, are placed on the memory cell 100 connecting the SRAM layout (i.e., blocks 38, 39) to read ports 11, 12. The connections of true/complement nodes of the read port 10, 13 have to be implemented with the M1, V1 and M2 metal layers. In the read ports 10, 11, 12, 13 read bit lines 88, 89, 90, 91 are implemented. The write port 20 is connected as write word line WWL_0, the write port 21 as write word line WWL_1, the write port 22 as write word line WWL_2, the write port 23 as write word line WWL_3, the write port 24 as write word line WWL_4, the write port 25 as write word line WWL_5, the read port 10 as read word line RWL_0, the read port 11 as read word line RWL_1, the read port 12 as read word line RWL_2, the read port 13 as read port line RWL_3, respectively, via gate connections 36. In FIG. 20B, the positions of ground layer 46 and power layer 48 as well as positions for the 9 track units 82, 84, 86 are indicated in a floor plan. Here, power layer 48 is arranged at the bottom and separated from ground 46 by the first 9 track unit 82. Ground layer 46 is separated from the next power layer 48 by the second 9 track unit 84 and the power layer 48 is separated by the third 9 track unit 86 from the ground layer 46 on the top. Block 39 of the SRAM layout is electrically connected to ground 46 (VSS), block 38 to power layer 48 (VDD), and the read port circuits 16 to ground layer 46 (VSS).

In FIGS. 21, 22, 23, 24, 25 and 26 logical layout templates 106 of a memory cell 100 with different numbers of read ports 10, 11, 12, 13, 14, 15 and write ports 20, 21, 22, 23 included in the fourth design bucket 56 of FIGS. 1 and 2 are depicted.

Figure 21:
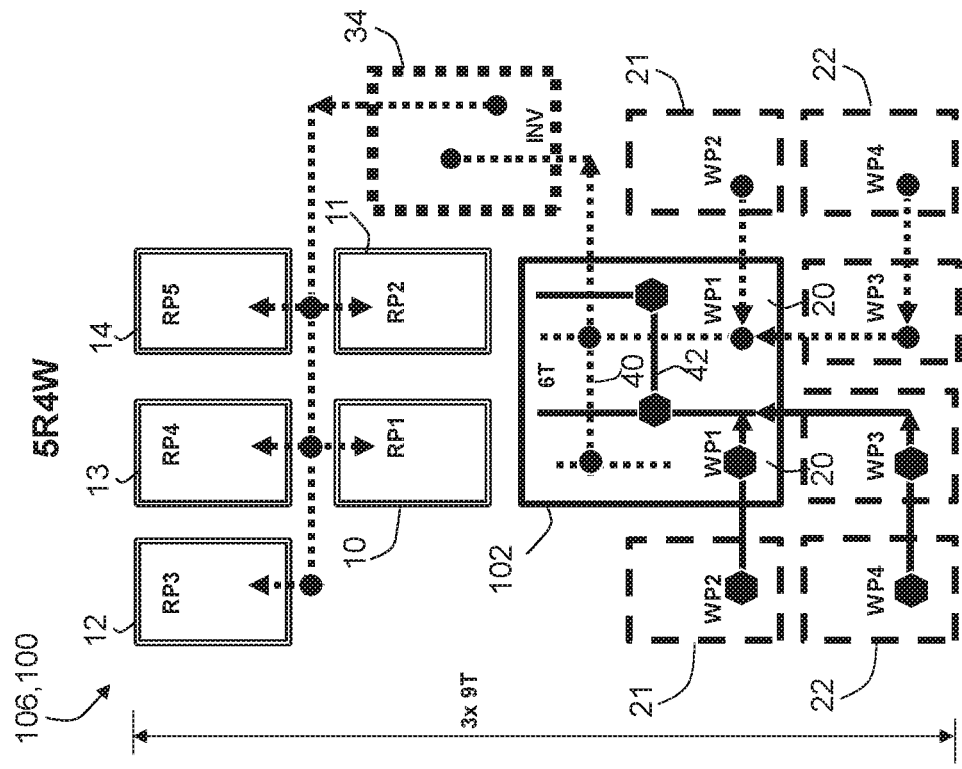
FIG. 21 depicts a logical layout template of a memory cell with six read ports, four write ports and load isolation inverter according to a third design bucket of an embodiment of the invention.
Figure 22:
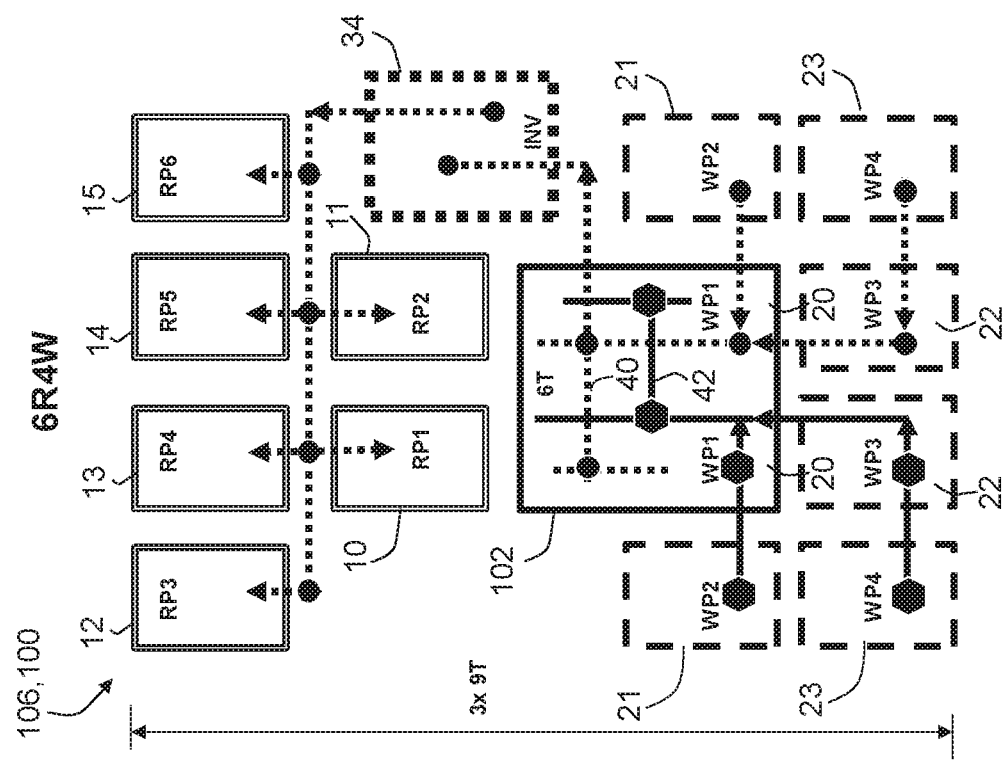
FIG. 22 depicts a logical layout template of a memory cell with five read ports, four write ports and load isolation inverter according to a third design bucket of an embodiment of the invention.
Figures 23, 24:
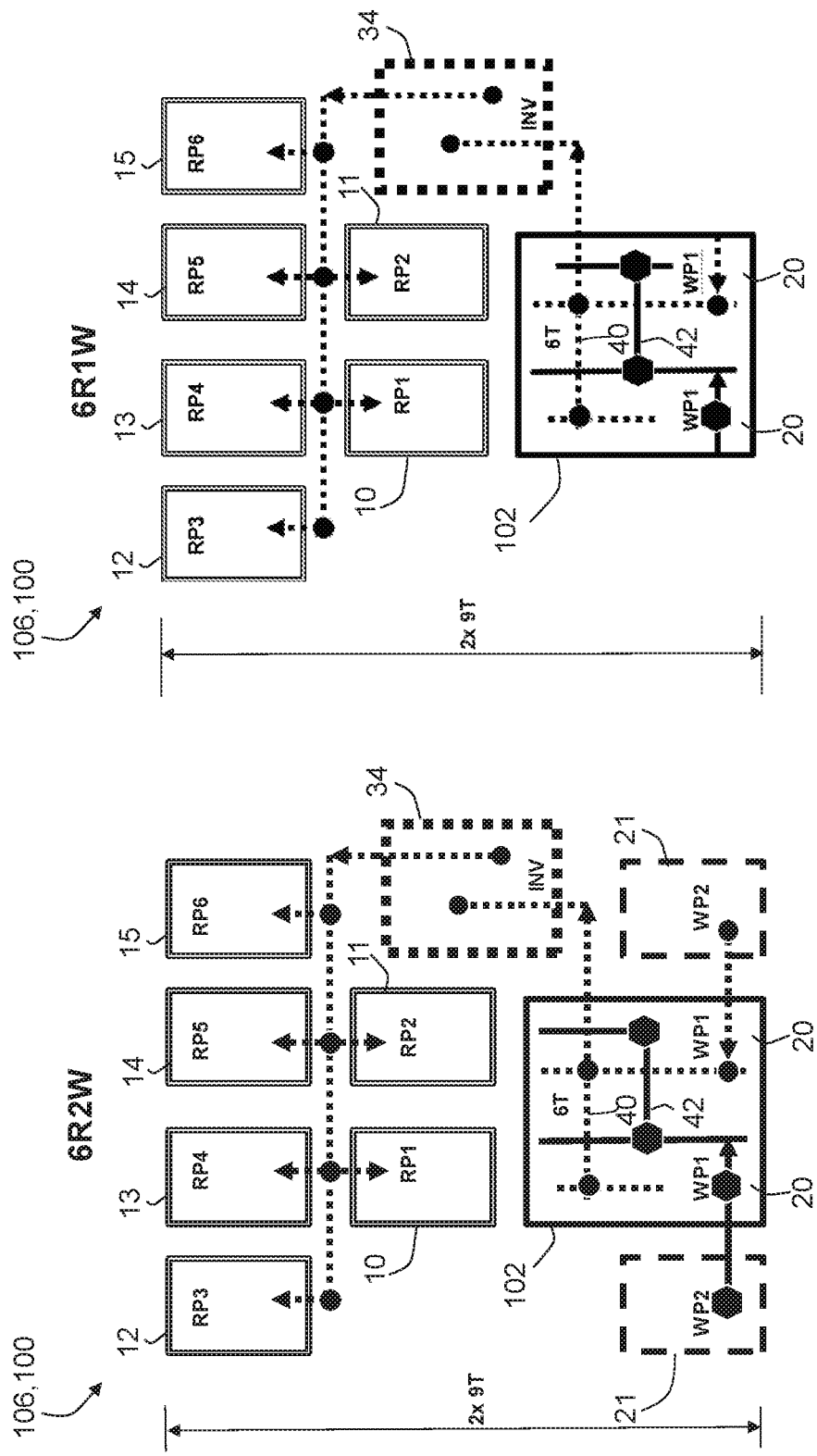
FIG. 23 depicts a logical layout template of a memory cell with six read ports, two write ports and load isolation inverter according to a third design bucket of an embodiment of the invention.
FIG. 24 depicts a logical layout template of a memory cell with six read ports, one write port and load isolation inverter according to a third design bucket of an embodiment of the invention.

FIG. 21 depicts a logical layout template 106 of a memory cell 100 with six read ports 10, 11, 12, 13, 14, 15 and four write ports 20, 21, 22, 23 and load isolation inverter 34 according to the fourth design bucket 56 of an embodiment of the invention. Similarly, FIG. 22 depicts a logical layout template 106 of a memory cell 100 with five read ports 10, 11, 12, 13, 14 and four write ports 20, 21, 22, 23 and load isolation inverter 34; FIG. 23 depicts a logical layout template 106 of a memory cell 100 with six read ports 10, 11, 12, 13, 14, 15 and two write ports 20, 21 and load isolation inverter 34; and FIG. 24 depicts a logical layout template 106 of a memory cell 100 with six read ports 10, 11, 12, 13, 14, 15 and one write port 20 and load isolation inverter 34.

FIG. 25 depicts a logical layout template 106 of memory cell 100 with five read ports 10, 11, 12, 13, 14 and one write port 20 and load isolation inverter 34. FIG. 26 depicts a logical layout template 106 of a memory cell 100 with five read ports 10, 11, 12, 13, 14 and two write ports 20, 21 and load isolation inverter 34. The layouts are generally twelve contacted poly pitch (CPP) wide at the front end of line and have a height of three 9 track units for the layout of FIGS. 21 and 22 and two 9 track units for the layouts of FIGS. 23 to 26. The embodiments shown in FIGS. 21 to 26, as well as in all other logical layouts shown, mark true storage nodes 30 of the memory cell 100 with black circles and complement storage nodes with black hexagons 32. True storage nodes 30 are connected via dotted lines and complement storage nodes 32 with solid lines.

FIGS. 27A and 27B depict a logical layout template 106 of the memory cell 100 with six read ports 10, 11, 12, 13, 14, 15 and four write ports 20, 21, 22, 23 according to FIG. 21.

For the embodiment shown in FIG. 27A, read ports 10, 11, 12, 13, 14, 15 and write ports 21, 22, 23 are added to the design of the base memory cell 102. Therefore, as in the layout template 106 for the base memory cell 102 shown in FIG. 3, the six transistor SRAM layout is implemented in two blocks 38, 39 (i.e., 6T SRAM 38 and 6T STRAM 39) on the memory cell 100. In the SRAM circuit (i.e., block 39) a write bit line 94 is implemented for compare state and a write bit line 95 for true state of the write port 20. Further write bit lines 96, 97, 98, 99, 120, 121 are placed in the further write ports 21, 22, 23. The memory cell 100 is twelve contacted poly pitch (CPP) wide and has a height of three 9 track units. The internal tru/cmp wiring to the gate and drain connections of the read and write ports are implemented with the M1, V1, M2 wiring and are not depicted in FIG. 27A. The write port 20 is connected as write word line WWL_0, the write port 21 as write word line WWL_1, the write port 22 as write word line WWL_2, the write port 23 as write word line WWL_3, the read port 10 as read word line RWL_0, the read port 11 as read word line RWL_1, the read port 12 as read word line RWL_2, the read port 13 as read port line RWL_3, the read port 14 as read port line RWL_4, the read port 15 as read port line RWL_5, respectively, via gate connections 36. In FIG. 27B, the positions of ground layers 46 and power layers 48 as well as positions for the 9 track units 82, 84, 86 are indicated in a floor plan. Here, the power layer 48 is arranged at the bottom and separated from the ground layer 46 by a first 9 track unit 82. Ground layer 46 is separated from the next power layer 48 by the second 9 track unit 84 and power layer 48 is separated by the third 9 track unit 86 from ground layer 46 on the top. Block 39 of the SRAM circuit is electrically connected to ground 46 (VSS), block 38 to power layer 48 (VDD), and the read port circuits 16 to ground layer 46 (VSS).

Figure 28:
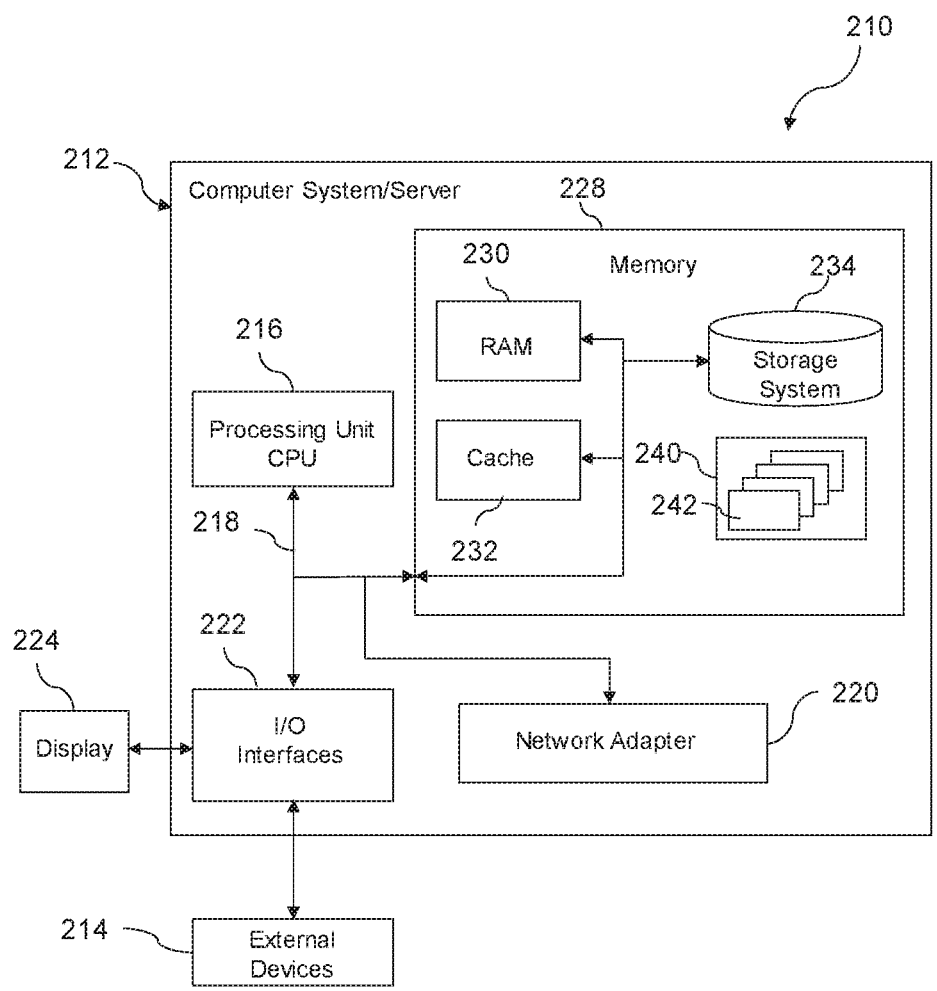
FIG. 28 depicts an example embodiment of a data processing system for executing a method according to the invention.

Referring now to FIG. 28, a schematic of an example of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

In data processing system 210 there is a computer system/server 212, which is operational with numerous other general-purpose or special-purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 28, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processing units 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 242 generally carry out the functions and/or methodologies of embodiments of the invention as described herein.

Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

Figure 29:
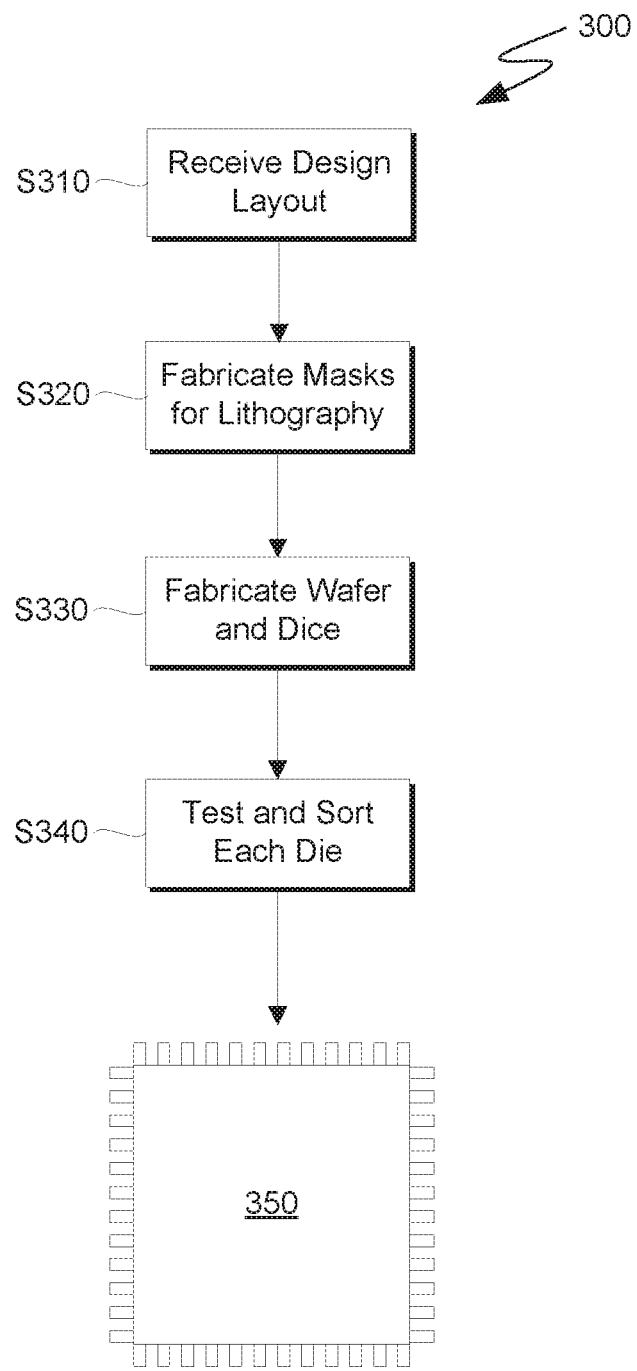
FIG. 29 depicts an example of a method for manufacturing an integrated circuit memory cell having a layout generated in accordance with various embodiments of the present invention.

FIG. 29 depicts a flowchart for manufacturing one or more integrated circuit memory cells having a layout generated in accordance with one or more embodiments of the present invention. More specifically, FIG. 29 depicts fabricating operations 300, which yield integrated circuit 350. The steps involved in fabricating integrated circuit 350 are well known to those of ordinary skill in the art and are discussed only briefly with respect to FIG. 29.

In some embodiments of fabricating operations 300, a foundry receives a design layout of a memory cell (S310). In some embodiments, the design layout of the memory cell is designed by a corporation or entity other than the one that fabricates the memory cell (i.e., a designer), in which case the designer provides the design layout of the memory cell to the fabricator (i.e., the foundry). The design layout can be modeled in accordance with the general design algorithm described with respect to FIGS. 1 and 2 and/or various other embodiments described herein. In general, the foundry receives a computer-readable design layout representing at least one memory cell, such as memory cell 100. The computer-readable design layout can be created using various elements of computer system/server 212 (e.g., CPU/data processing unit 216 and Memory 228) of data processing system 210 described with respect to FIG. 28. In some embodiments, the design layout of the memory cell represents one element of a larger integrated circuit design received by the foundry.

Based on the received design layout, the foundry fabricates masks for lithography (S320). In general, the foundry duplicates the received design layout (and/or integrated circuit design) to optimize yield of integrated circuit(s) 350 based on an applicable wafer size. As will be understood by those of ordinary skill in the art, a lithographic mask is a photomask that defines a pattern that is to be applied to a wafer, generally, using a photolithographic stepper or scanner. The pattern of any one mask may represent one or more elements of the received design layout or the inverse of one or more elements of the received design layout. Multiple mask are generally required to form the features of the received design layout based on various layers and design elements of the received design layout. The masks are ordered such that processing the masks in sequence, including various other operations, produces the intended design. In some embodiments, similar masks for wet or dry etching and/or deposition are used in combination with or in place of lithographic masks.

The foundry utilizes the fabricated mask(s) to fabricate the received design layout on a wafer, generally including a plurality of instances of the received design layout, and dices the wafer to form discrete memory cells and/or integrated circuits incorporating the received design layout (S330). Persons of ordinary skill in the art will understand that the process of fabricating the wafer can include any number and combination of lithographic, wet and/or dry etching, deposition, and/or planarization operations, as well as various other integrated circuit fabrication operations known in the art that are required or advantageous in producing integrated circuit 350. The foundry tests and sorts each die (S340), or at least a subset of dies, to yield integrated circuit 350 based on the results of the test and sorting operations.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, a list of alternatives such as "at least one of A, B, and C" should be interpreted to mean "at least one A, at least one B, at least one C, or any combination of A, B, and C."

Additionally, the phrase "based on" should be interpreted to mean "based, at least in part, on."

The term "exemplary" means of or relating to an example and should not be construed to indicate that any particular embodiment is preferred relative to any other embodiment.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

REFERENCE NUMERALS

10 RP
11 RP
12 RP
13 RP
14 RP
15 RP
20 WP
21 WP
22 WP
23 WP
24 WP
25 WP
30 true storage node
32 complement storage node
34 inverter
36 gate connection
38 6T SRAM
39 6T SRAM
40 extension point
42 extension point
46 ground
48 power 50 design bucket
52 design bucket
54 design bucket
56 design bucket
58 cell dimension
60 cell dimension
62 cell dimension
64 cell dimension
71 PC
72 PC
73 PC
74 PC
75 PC
76 PC
77 PC
78 PC
79 PC
80 PC
82 9 track unit
84 9 track unit
86 9 track unit
88 RBL
89 RBL
90 RBL
91 RBL
92 RBL
93 RBL
94 WBL
95 WBL
96 WBL
97 WBL
98 WBL
99 WBL
100 memory cell
102 base memory cell
104 cell boundary
106 layout template
110 p-channel FET
112 n-channel FET
120 WBL
121 WBL
122 WBL
123 WBL
124 WBL
125 WBL
210 data processing system
212 computer system/server
214 external devices
216 CPU/data processing unit
218 IO Bus
220 network adapter
222 IO interfaces
224 display
228 memory
230 RAM
232 cache
234 storage system
240 program/utility
242 program modules
L1 direction
L2 direction

What is claimed is:

1. A method for generating a layout of a multi-port memory cell, the method comprising:
defining a specification of a memory cell, the specification describing at least one port within the memory cell;
modeling a base memory cell, wherein the base memory cell includes at least one extension point;
identifying, within the specification, a port that interfaces with the base memory cell; and
modeling an electrical interface between the port that interfaces with the base memory cell and an extension point of the base memory cell.

2. The method of claim 1, further comprising:
selecting one design bucket from a predefined set of design buckets based on a count of ports corresponding to the at least one port within the memory cell described by the specification, each design bucket corresponding to a respective layout template including the base memory cell and a respective maximum count of ports; and
modeling each electrical interface including the at least one port described in the specification based on the selected design bucket and the respective layout template.

3. The method of claim 2, wherein the predefined set of design buckets includes (i) a first design bucket corresponding to a first maximum count of ports equal to a count of read ports and write ports less than or equal to two, (ii) a second design bucket corresponding to a second maximum count of ports equal to a count of write ports less than or equal to three, wherein a count of read port is less than or equal to four, (iii) a third design bucket corresponding to a third maximum count of ports equal to a count of write ports less than or equal to 6, wherein a count of read ports is less than or equal to four, and (iv) a fourth design bucket corresponding to a fourth maximum count or ports equal to a count of read ports less than or equal to six and a count of write ports less than or equal to four.

4. The method of claim 3, wherein each layout template having a count of ports that is less than or equal to eight utilizes a two 9 track unit design image of the memory cell and each layout template having a count ports that is more than eight utilizes a three 9 track unit design image of the memory cell.

5. The method of claim 2, wherein the layout template includes at least one poly contact, each poly contacting connecting at least two ports of the memory cell, and wherein the extension point is located at one of the poly contacts.

6. The method of claim 1, further comprising:
determining that the specification describes at least one read port and at least one write port; and
modeling the at least one read port symmetrically to the at least one write port about a first symmetry line of the base memory cell.

7. The method of claim 6, further comprising:
determining that the specification describes at least two read ports and at least two write ports;
modeling the at least two read ports symmetrically to each other about a second symmetry line; and
modeling the at least two write ports symmetrically to each other about the second symmetry line.

8. The method of claim 1, further comprising:
in response to determining that the specification describes a count of ports within the memory cell that exceeds a count of four ports, adding an additional inverter to the base memory cell.

9. The method of claim 1, wherein the base memory cell includes six transistors and one write port.

10. The method of claim 9, wherein the base memory cell intrinsically implements a true write bit line, a complement write bit line, and one write word line.

11. A computer program product for generating a layout of a multi-port memory cell, the computer program product comprising:
   a computer readable storage medium and program instructions stored on the computer readable storage medium, the program instructions comprising:
      program instructions to define a specification of a memory cell, the specification describing at least one port within the memory cell;
      program instructions to model a base memory cell, wherein the base memory cell includes at least one extension point;
      program instructions to identify, within the specification, a port that interfaces with the base memory cell; and
      program instructions to model an electrical interface between the port that interfaces with the base memory cell and an extension point of the base memory cell.

12. The computer program product of claim 11, the program instructions further comprising:
   program instructions to select one design bucket from a predefined set of design buckets based on a count of ports corresponding to the at least one port within the memory cell described by the specification, each design bucket corresponding to a respective layout template including the base memory cell and a respective maximum count of ports; and
   program instructions to model each electrical interface including the at least one port described in the specification based on the selected design bucket and the respective layout template.

13. The computer program product of claim 12, wherein the predefined set of design buckets includes (i) a first design bucket corresponding to a first maximum count of ports equal to a count of read ports and write ports less than or equal to two, (ii) a second design bucket corresponding to a second maximum count of ports equal to a count of write ports less than or equal to three, wherein a count of read port is less than or equal to four, (iii) a third design bucket corresponding to a third maximum count of ports equal to a count of write ports less than or equal to 6, wherein a count of read ports is less than or equal to four, and (iv) a fourth design bucket corresponding to a fourth maximum count or ports equal to a count of read ports less than or equal to six and a count of write ports less than or equal to four.

14. The computer program product of claim 11, the program instructions further comprising:
   program instructions to determine that the specification describes at least one read port and at least one write port; and
   program instructions to model the at least one read port symmetrically to the at least one write port about a first symmetry line of the base memory cell.

15. The computer program product of claim 14, the program instructions further comprising:
   program instructions to determine that the specification describes at least two read ports and at least two write ports;
   program instructions to model the at least two read ports symmetrically to each other about a second symmetry line; and
   program instructions to model the at least two write ports symmetrically to each other about the second symmetry line.

16. A computer system for generating a layout of a multi-port memory cell, the computer system comprising:
   one or more computer processors;
   one or more computer readable storage media;
   program instructions stored on the one or more computer readable storage media for execution by at least one of the one or more processors, the program instructions comprising:
      program instructions to define a specification of a memory cell, the specification describing at least one port within the memory cell;
      program instructions to model a base memory cell, wherein the base memory cell includes at least one extension point;
      program instructions to identify, within the specification, a port that interfaces with the base memory cell; and
      program instructions to model an electrical interface between the port that interfaces with the base memory cell and an extension point of the base memory cell.

17. The computer system of claim 16, the program instructions further comprising:
   program instructions to select one design bucket from a predefined set of design buckets based on a count of ports corresponding to the at least one port within the memory cell described by the specification, each design bucket corresponding to a respective layout template including the base memory cell and a respective maximum count of ports; and
   program instructions to model each electrical interface including the at least one port described in the specification based on the selected design bucket and the respective layout template.

18. The computer system of claim 17, wherein the predefined set of design buckets includes (i) a first design bucket corresponding to a first maximum count of ports equal to a count of read ports and write ports less than or equal to two, (ii) a second design bucket corresponding to a second maximum count of ports equal to a count of write ports less than or equal to three, wherein a count of read port is less than or equal to four, (iii) a third design bucket corresponding to a third maximum count of ports equal to a count of write ports less than or equal to 6, wherein a count of read ports is less than or equal to four, and (iv) a fourth design bucket corresponding to a fourth maximum count or ports equal to a count of read ports less than or equal to six and a count of write ports less than or equal to four.

19. The computer system of claim 16, the program instructions further comprising:
   program instructions to determine that the specification describes at least one read port and at least one write port; and
   program instructions to model the at least one read port symmetrically to the at least one write port about a first symmetry line of the base memory cell.

20. The computer system of claim 19, the program instructions further comprising:
   program instructions to determine that the specification describes at least two read ports and at least two write ports;
   program instructions to model the at least two read ports symmetrically to each other about a second symmetry line; and
   program instructions to model the at least two write ports symmetrically to each other about the second symmetry line.

\* \* \* \* \*